(12) United States Patent
Takita et al.

(10) Patent No.: US 11,404,588 B2
(45) Date of Patent: Aug. 2, 2022

(54) IMAGING PANEL

(71) Applicant: Sharp Kabushiki Kaisha, Osaka (JP)

(72) Inventors: Rikiya Takita, Sakai (JP); Fumiki Nakano, Sakai (JP); Wataru Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/099,810

(22) Filed: Nov. 17, 2020

(65) Prior Publication Data

US 2021/0184058 A1 Jun. 17, 2021

Related U.S. Application Data

(60) Provisional application No. 62/946,480, filed on Dec. 11, 2019.

(51) Int. Cl.
| | |
|---|---|
| *H01L 27/14* | (2006.01) |
| *H01L 31/02* | (2006.01) |
| *H01L 31/115* | (2006.01) |
| *H01L 27/146* | (2006.01) |

(52) U.S. Cl.
CPC .. *H01L 31/02019* (2013.01); *H01L 27/14603* (2013.01); *H01L 27/14609* (2013.01); *H01L 27/14636* (2013.01); *H01L 31/115* (2013.01)

(58) Field of Classification Search
CPC ............. H01L 31/02019; H01L 31/115; H01L 27/14603; H01L 27/14609; H01L 27/14636; H01L 29/78666; H01L 29/78675; H01L 29/66757; H01L 29/78648

USPC ........................................................ 257/431

See application file for complete search history.

(56) References Cited

U.S. PATENT DOCUMENTS

| | | | |
|---|---|---|---|
| 6,921,918 B2* | 7/2005 | Park ................... | H01L 29/78675 257/72 |
| 2004/0179649 A1* | 9/2004 | Yagi ................... | H01L 27/14609 378/97 |
| 2014/0335641 A1* | 11/2014 | Xu ..................... | H01L 27/14692 438/57 |
| 2019/0103494 A1* | 4/2019 | Hara ................... | H01L 29/7869 |
| 2019/0355774 A1* | 11/2019 | Misaki ................ | H04N 5/374 |

FOREIGN PATENT DOCUMENTS

JP 2014-132661 A 7/2014

* cited by examiner

*Primary Examiner* — Calvin Y Choi
(74) *Attorney, Agent, or Firm* — Keating & Bennett, LLP

(57) ABSTRACT

An imaging panel includes an imaging element that is formed on a substrate. The imaging element includes a gate line, a source line, a switching element, a photoelectric conversion element, and a bias line. The gate line and the source line are formed in a layer in which a part of the switching element is formed, a layer in which a part of the photoelectric conversion element is formed, or a layer in which the bias line is formed.

6 Claims, 23 Drawing Sheets

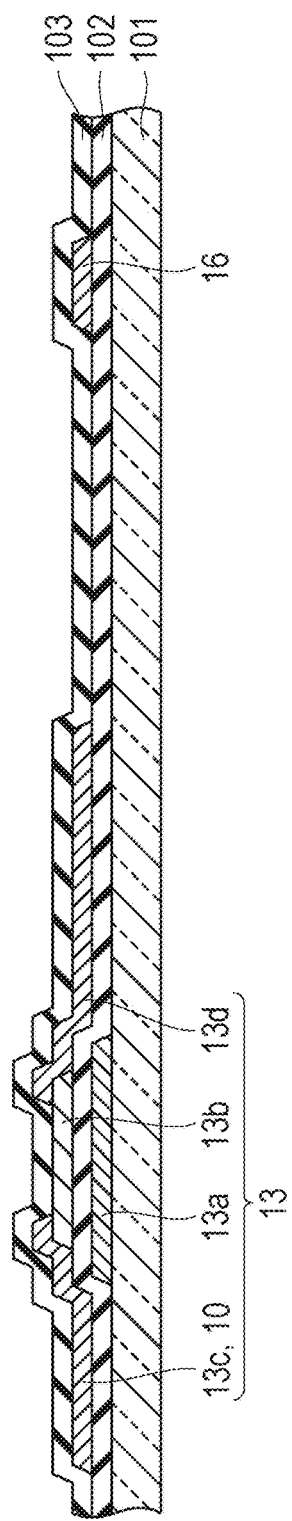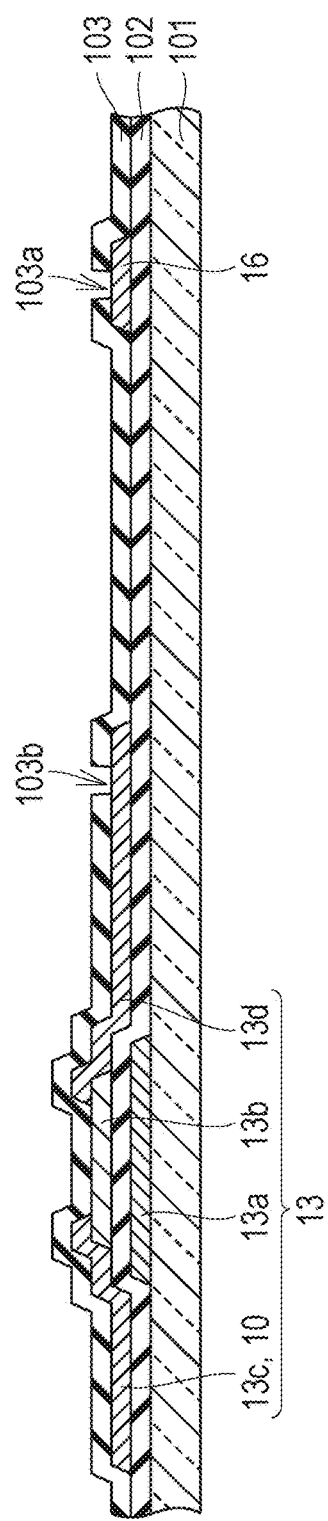

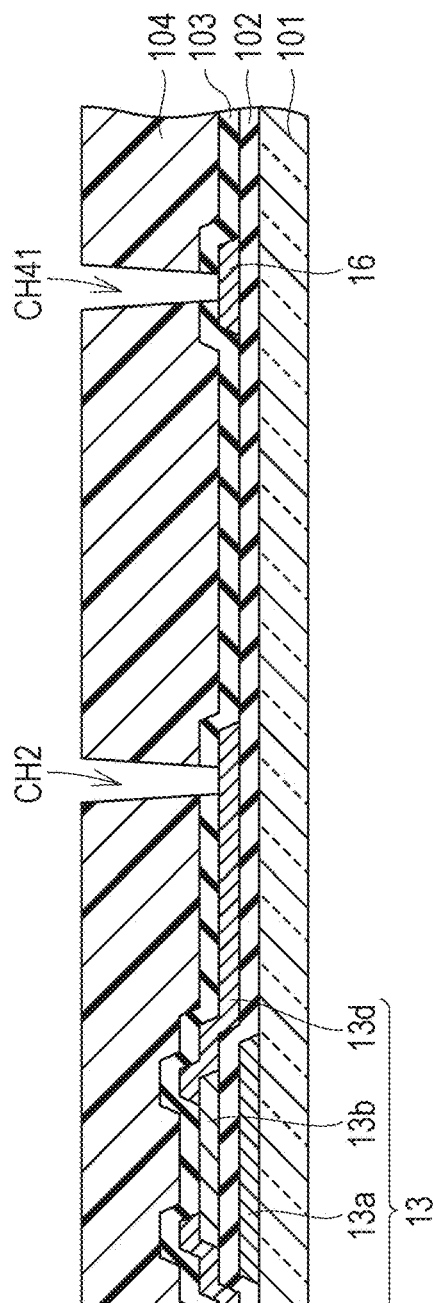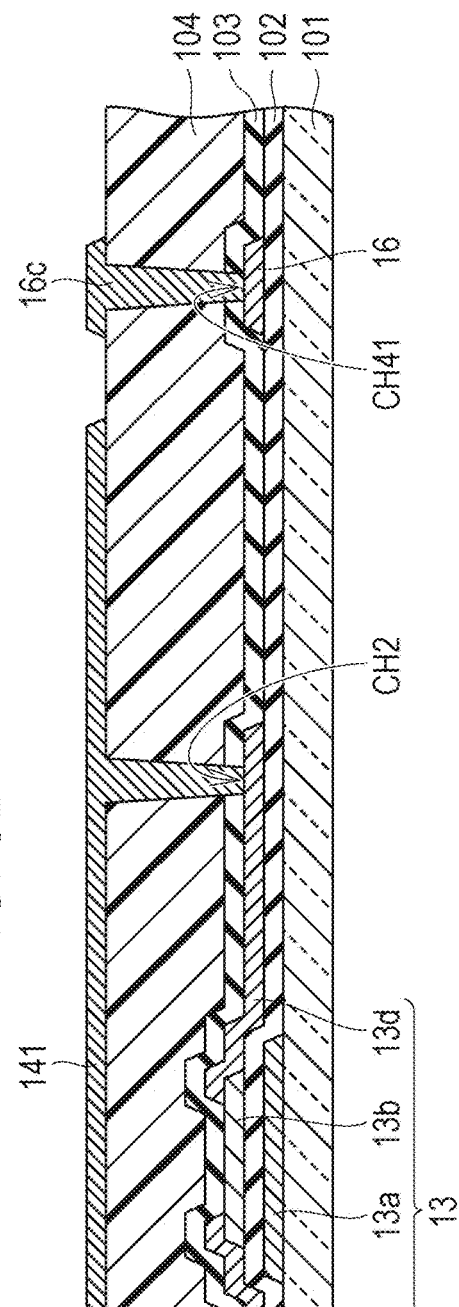

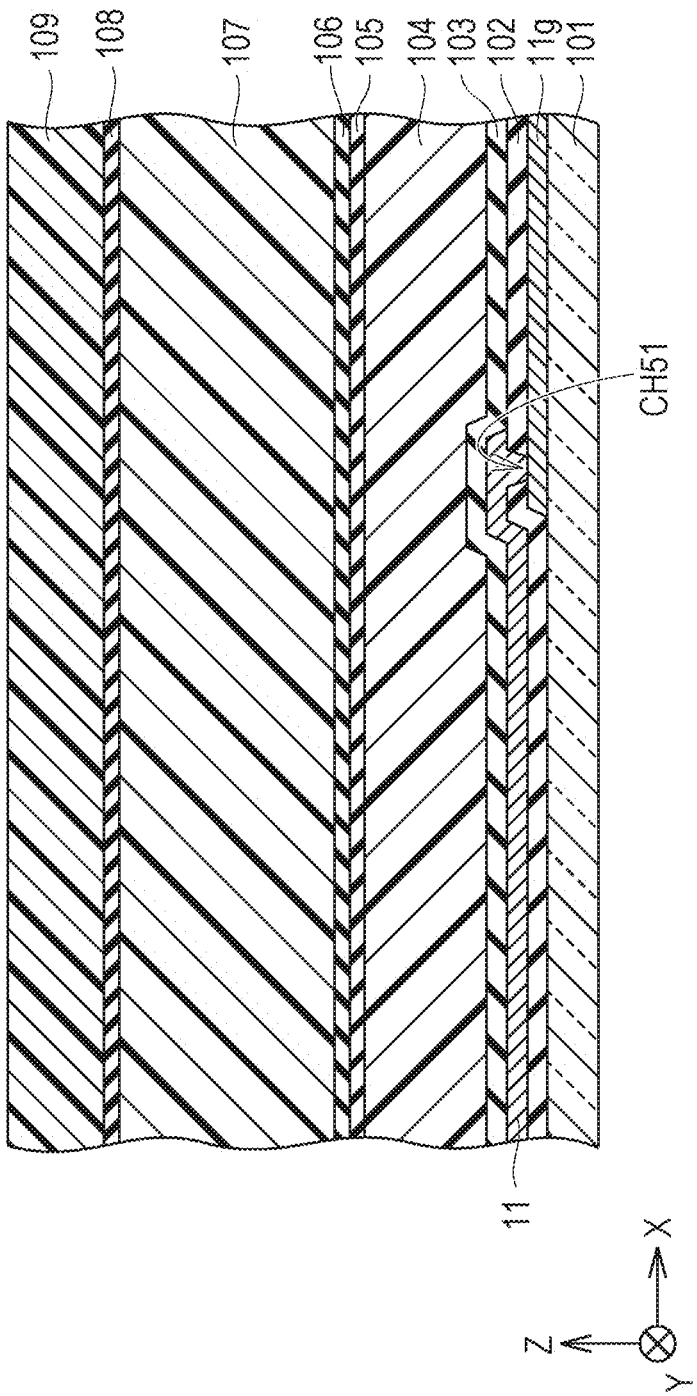

IMAGING PANEL

BACKGROUND

1. Field

The disclosure described below relates to an imaging panel.

2. Description of the Related Art

Imaging panels that have been provided include photoelectric conversion elements that convert X-rays radiated to objects into electric charges and that are arranged in a matrix. Japanese Unexamined Patent Application Publication No. 2014-132661 discloses such an imaging panel. In the imaging panel, a common electrode wiring line that is connected to an upper electrode on a semiconductor layer of a photoelectric conversion element that is disposed above a substrate is located nearer than the photoelectric conversion element to the substrate. Through the common electrode wiring line, a bias voltage is applied to the upper electrode. The upper electrode is composed of a highly transparent material such as ITO or IZO, and the common electrode wiring line is composed of a metal material that has low resistivity such as aluminum. As for the imaging panel, in which the common electrode wiring line is located nearer than the photoelectric conversion element to the substrate, the common electrode wiring line does not impede incidence onto the photoelectric conversion element, and the efficiency of conversion of the photoelectric conversion element does not decrease.

The performance of the imaging panel affects not only the efficiency of conversion of the photoelectric conversion element but also a reaction rate when an electric charge that is converted by the photoelectric conversion element is read, and so on. The electric charge that is converted by the photoelectric conversion element is read by driving a gate line and a source line that are disposed in a pixel that includes the photoelectric conversion element. The lower the resistivity of the gate line and the source line, the higher the transmission speed of a signal on the gate line and the source line. Consequently, the reaction rate when the electric charge that is converted by the photoelectric conversion element is read increases, and the performance of the imaging panel improves. The disclosure described below provides an imaging panel that enables manufacturing costs to be reduced and that has high performance.

SUMMARY

According to an aspect of the disclosure, an imaging panel includes a substrate, and an imaging element that is formed on the substrate. The imaging element includes a gate line, a source line, a switching element that is connected to the gate line and the source line, a photoelectric conversion element that is connected to the switching element, and a bias line that is connected to the photoelectric conversion element. The gate line and the source line are formed in a layer in which a part of the switching element is formed, a layer in which a part of the photoelectric conversion element is formed, or a layer in which the bias line is formed.

BRIEF DESCRIPTION OF THE DRAWINGS

FIG. 5A is a sectional view illustrating a process for manufacturing the active matrix substrate according to the first embodiment and illustrates a state in which TFTs 13, gate electrode wiring lines 11g, gate insulating films 102, and insulating films 103 are formed above the substrate;

FIG. 5B is a sectional view illustrating a state in which an opening of each insulating film 103 is formed after the process in FIG. 5A;

FIG. 5C is a sectional view illustrating a state in which flattening films 104 are formed after a process in FIG. 5B;

FIG. 5D is a sectional view illustrating a state in which first cathode electrodes 141 and connection wiring lines 16c are formed after a process in FIG. 5C;

FIG. 8 is a schematic sectional view taken along line VIII-VIII in FIG. 6;

DESCRIPTION OF THE EMBODIMENTS

Figure 1:
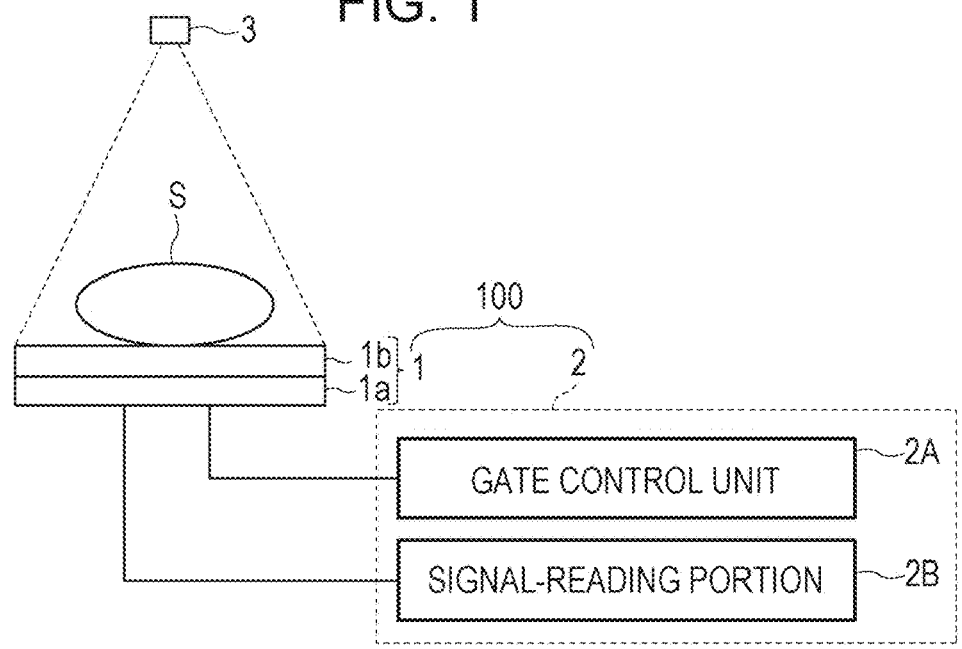
FIG. 1 schematically illustrates an X-ray imaging apparatus according to a first embodiment.

Embodiments of the present disclosure will hereinafter be described in detail with reference to the drawings. In the drawings, components like to or corresponding to each other are designated by like reference characters, and a description thereof is not repeated.

First Embodiment

Structure

FIG. 1 schematically illustrates an X-ray imaging apparatus that uses an imaging panel according to the present embodiment. An X-ray imaging apparatus 100 includes an imaging panel 1 and a control unit 2. An X-ray source 3 that radiates X-rays is disposed above the imaging panel 1.

The imaging panel 1 includes an active matrix substrate 1a and a scintillator 1b that is disposed on the active matrix substrate 1a.

The control unit 2 includes a gate control unit 2A and a signal-reading portion 2B. X-rays are radiated from the X-ray source 3 to an object S. The X-rays that pass through the object S are converted into fluorescence (referred to below as scintillation light) at the scintillator 1b. The imaging panel 1 receives the scintillation light and convers the scintillation light into electric charges depending on the amount of the received light. The gate control unit 2A and the signal-reading portion 2B are driven, and an X-ray image based on the electric charges in the imaging panel 1 is consequently obtained.

Figure 2:
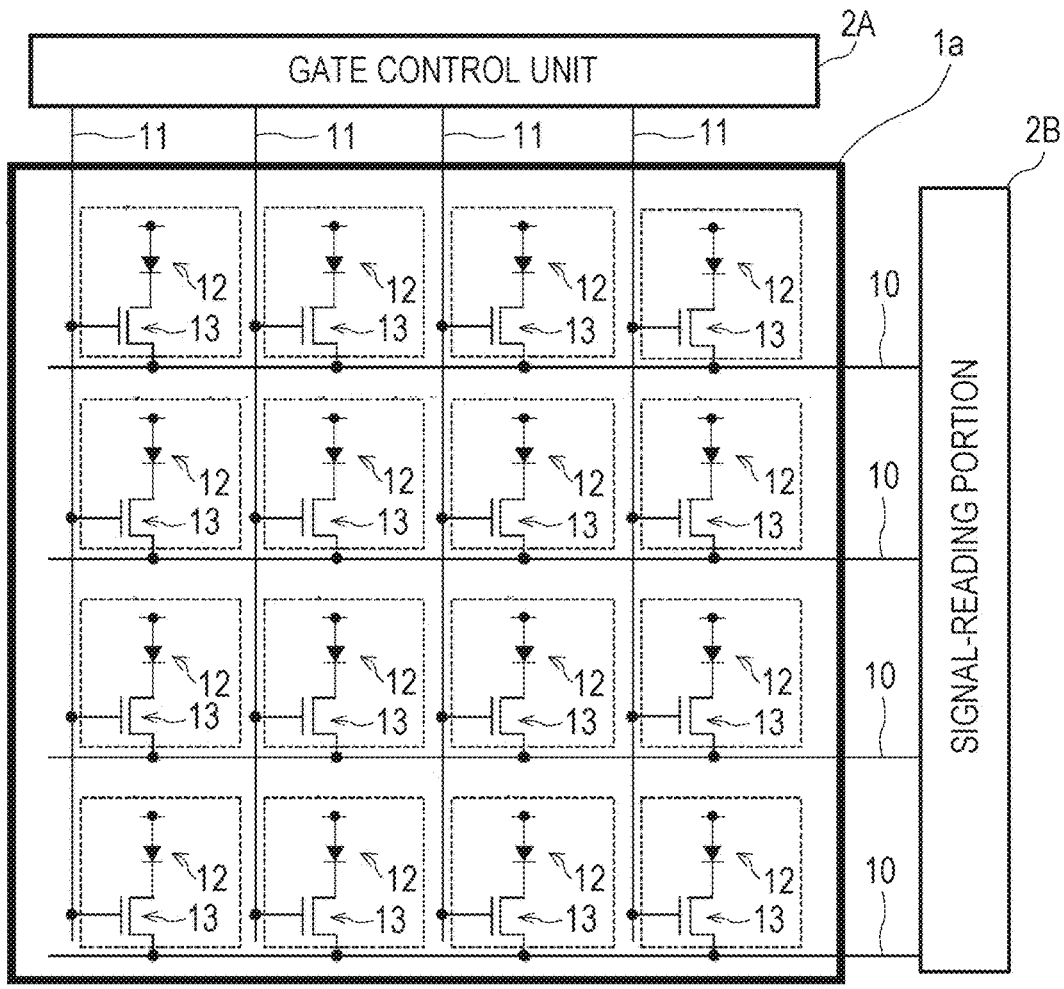
FIG. 2 schematically illustrates the structure of an active matrix substrate illustrated in FIG. 1.

FIG. 2 schematically illustrates the structure of the active matrix substrate 1a. As illustrated in FIG. 2, the active matrix substrate 1a includes source wiring lines 10 and gate wiring lines 11. The gate wiring lines 11 are connected to the gate control unit 2A, and the source wiring lines 10 are connected to the signal-reading portion 2B.

The active matrix substrate 1a has regions (referred to below as pixels) that are defined by the source wiring lines 10 and the gate wiring lines 11. Each pixel includes a TFT 13 (a switching element) that is connected to the source wiring line 10 and the gate wiring line 11 for the pixel. The pixel also includes a photodiode 12 that is connected to the TFT 13. The photodiode 12 converts the scintillation light, into which the X-rays that pass through the object S are converted, into an electric charge depending on the amount of the light.

The state of each gate wiring line 11 is sequentially changed into a selection state by the gate control unit 2A. Each TFT 13 is turned on when the state of the gate wiring line 11 connected thereto becomes the selection state. When the TFT 13 is turned on, a signal depending on the electric charge that is converted by the photodiode 12 is outputted to the signal-reading portion 2B via the source wiring line 10.

Figure 3:
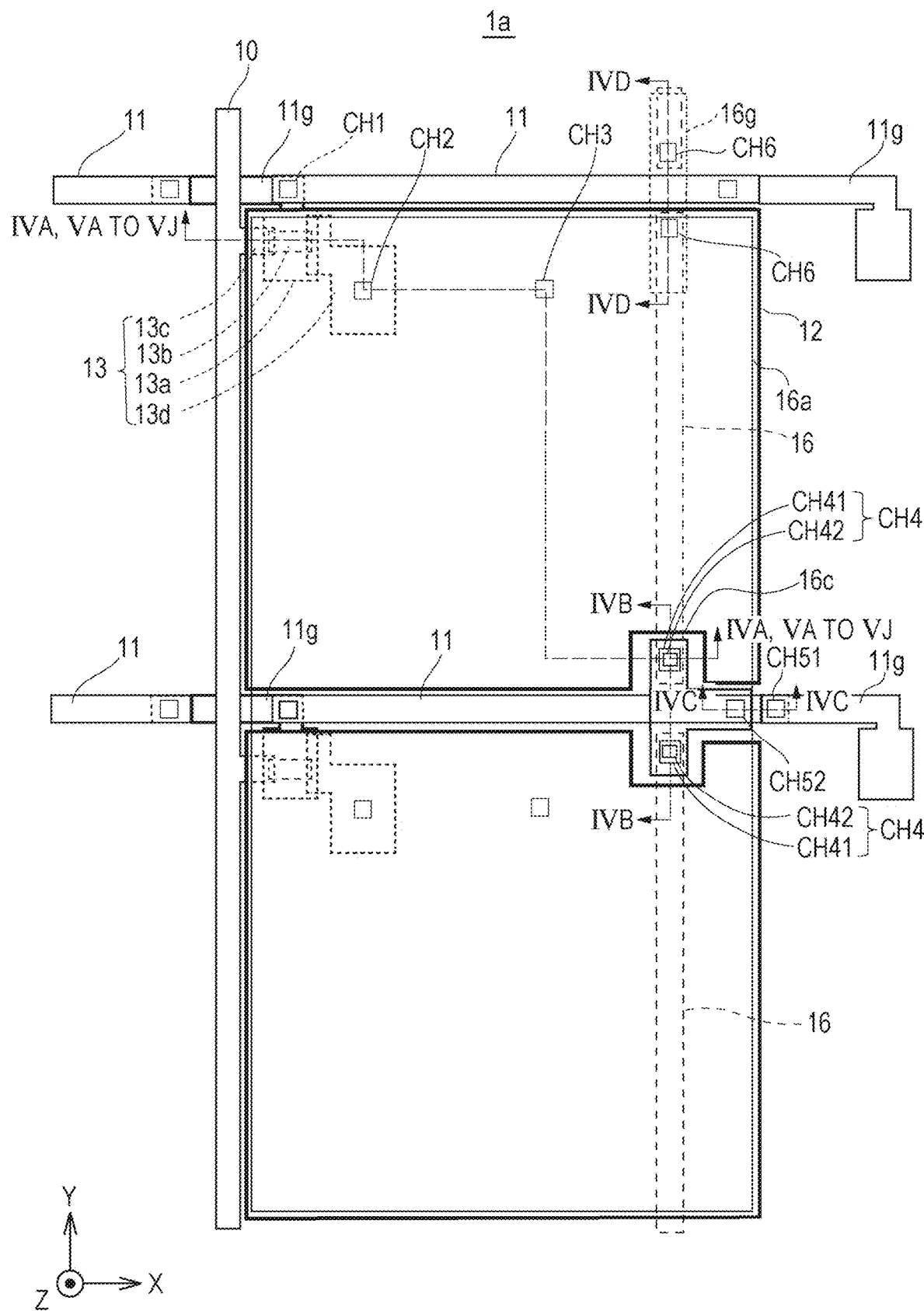
FIG. 3 is a schematic plan view of pixels of the active matrix substrate illustrated in FIG. 2.

FIG. 3 is an enlarged plan view of pixels of the active matrix substrate 1a illustrated in FIG. 2.

As illustrated in FIG. 3, each TFT 13 includes a gate electrode 13a, a semiconductor active layer 13b, a source electrode 13c, and a drain electrode 13d. The photodiode 12 is disposed so as to cover the TFT 13 and is connected to the TFT 13 with a contact hole CH2 interposed therebetween.

As illustrated in FIG. 3, the source wiring lines 10 extend in a Y-axis direction. The source wiring lines 10 are arranged at a regular interval in an X-axis direction. According to the present embodiment, the source wiring lines 10 are formed so as to be continuous with the source electrodes 13c. Each gate wiring line 11 is composed of the same material as the source electrodes 13c, the drain electrodes 13d, and the source wiring lines 10 and is formed in a layer in which the source electrodes 13c, the drain electrodes 13d, and the source wiring lines 10 are formed. The layer in which the source electrodes 13c, the drain electrodes 13d, and the source wiring lines 10 are formed is composed of the same material as the source electrodes 13c, the drain electrodes 13d, and the source wiring lines 10 and is obtained by performing a process for forming these. The process will be described later.

The gate wiring lines 11 extend in the X-axis direction to positions near the source wiring lines 10 and are connected to gate electrode wiring lines 11g continuous with the gate electrodes 13a at the positions near the source wiring lines 10 with contact holes CH1 interposed therebetween. That is, according to the present embodiment, the gate wiring lines 11 are divided near positions at which the gate wiring lines 11 intersect the source wiring lines 10, and the divided gate wiring lines 11 are connected by the gate electrode wiring lines 11g.

As illustrated in FIG. 3, bias wiring lines 16 are disposed so as to overlap the photodiodes 12 in a plan view, and the bias wiring lines 16 and the photodiodes 12 are connected to each other with contact holes CH3 interposed therebetween. Specific structures of contacts between the bias wiring lines 16 and the photodiodes 12 will be described later.

According to the present embodiment, each bias wiring line 16 is composed of the same material as the source wiring lines 10 and is formed in a layer in which the source wiring lines 10 are formed. The bias wiring lines 16 extend in the Y-axis direction to positions near the gate wiring lines 11 and are connected to connection wiring lines 16c or connection wiring lines 16g that are disposed in a layer that differs from the layer in which the source wiring lines 10 are formed, at positions near the gate wiring lines 11. Although specific structures of the connection wiring lines 16c and 16g will be described later, each connection wiring line 16g is composed of the same material as the gate electrodes 13a and is formed in a layer that is obtained by performing a process for forming the gate electrodes 13a. Each connection wiring line 16c is composed of the same material as parts of cathode electrodes 14 (see FIG. 4A) of the photodiodes 12 described later and is formed in a layer that is obtained by performing a process for forming the parts of the cathode electrodes 14.

That is, according to the present embodiment, the bias wiring lines 16 are divided near positions at which the bias wiring lines 16 intersect the gate wiring lines 11. The divided bias wiring lines 16 are connected by the connection wiring lines 16c or 16g. The connection wiring lines 16c and 16b have portions that overlap the bias wiring lines 16 in a plan view and portions that extend substantially parallel to the gate wiring lines 11. The connection wiring lines 16c are disposed, for example, so as to overlap some of the gate wiring lines 11 in even rows in a plan view and are connected to the bias wiring lines 16 that interpose the some of the gate wiring lines 11 with contact holes CH6 interposed therebetween. The connection wiring lines 16g are disposed, for example, so as to overlap some of the gate wiring lines 11 in odd rows in a plan view and are connected to the bias wiring lines 16 that interpose the some of the gate wiring lines 11 with contact holes CH4 interposed therebetween.

The structure of each pixel will now be specifically described with reference to FIG. 4A to FIG. 4D. FIG. 4A to FIG. 4D are schematic sectional views taken along line IVA-IVA, line IVB-IVB, line IVC-IVC, and line IVD-IVD illustrated in FIG. 3. In the following description, a positive Z-axis direction in FIG. 4A to FIG. 4D is referred to as an upper direction, and a negative Z-axis direction is referred to as a lower direction in some cases.

Figure 4A:
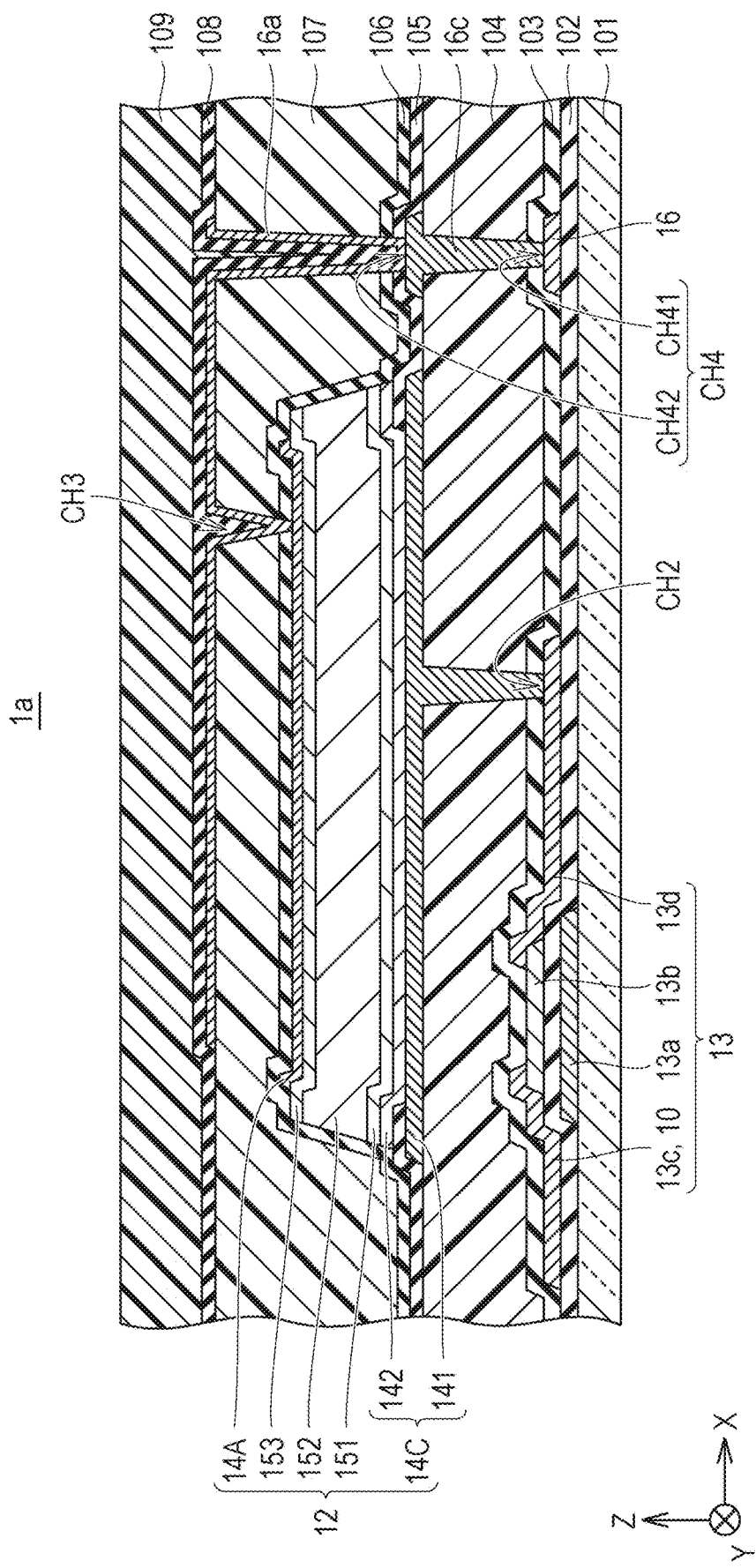
FIG. 4A is a schematic sectional view taken along line IVA-IVA in FIG. 3.
Figure 4B:
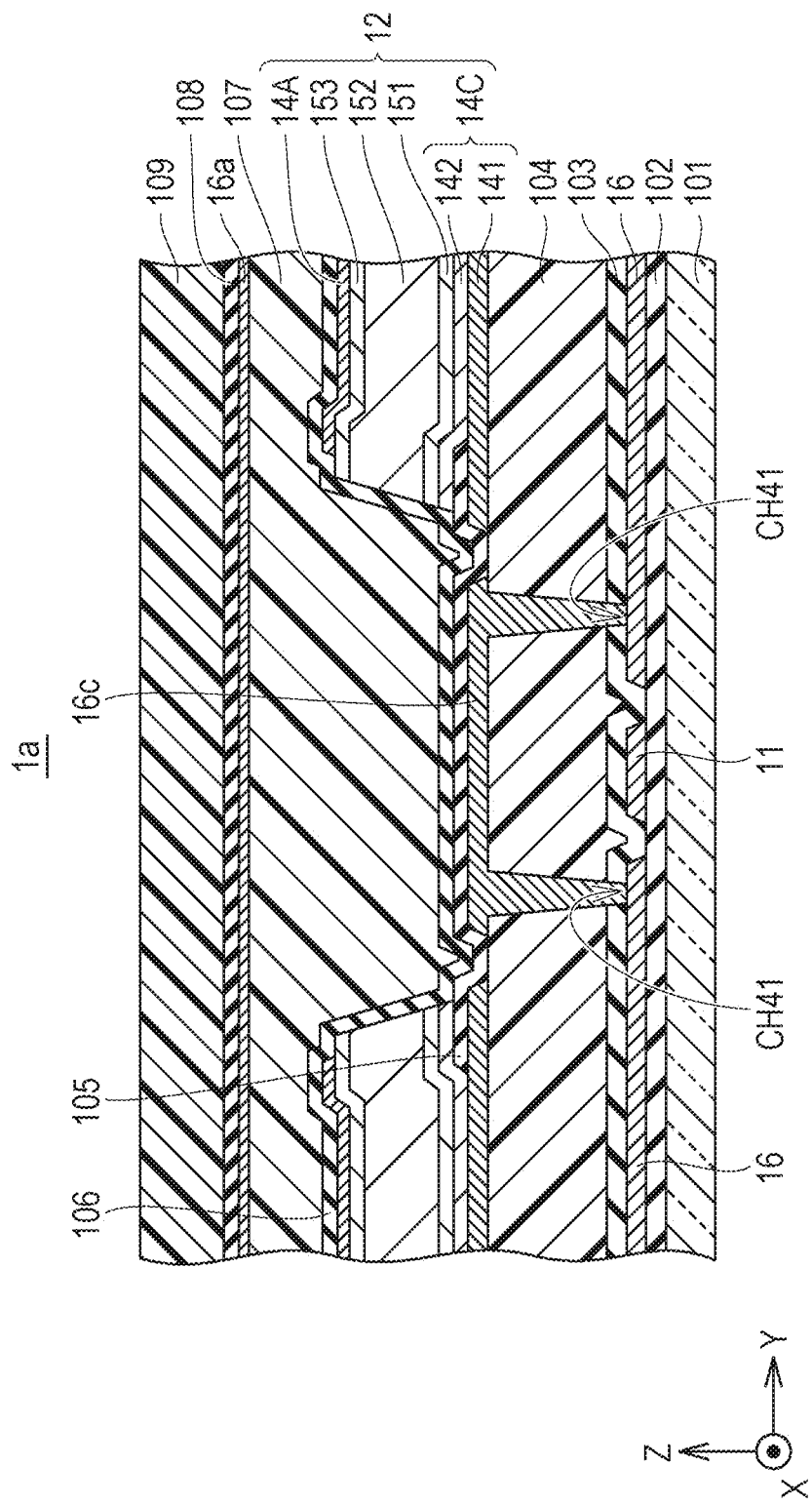
FIG. 4B is a schematic sectional view taken along line IVB-IVB in FIG. 3.
Figure 4C:
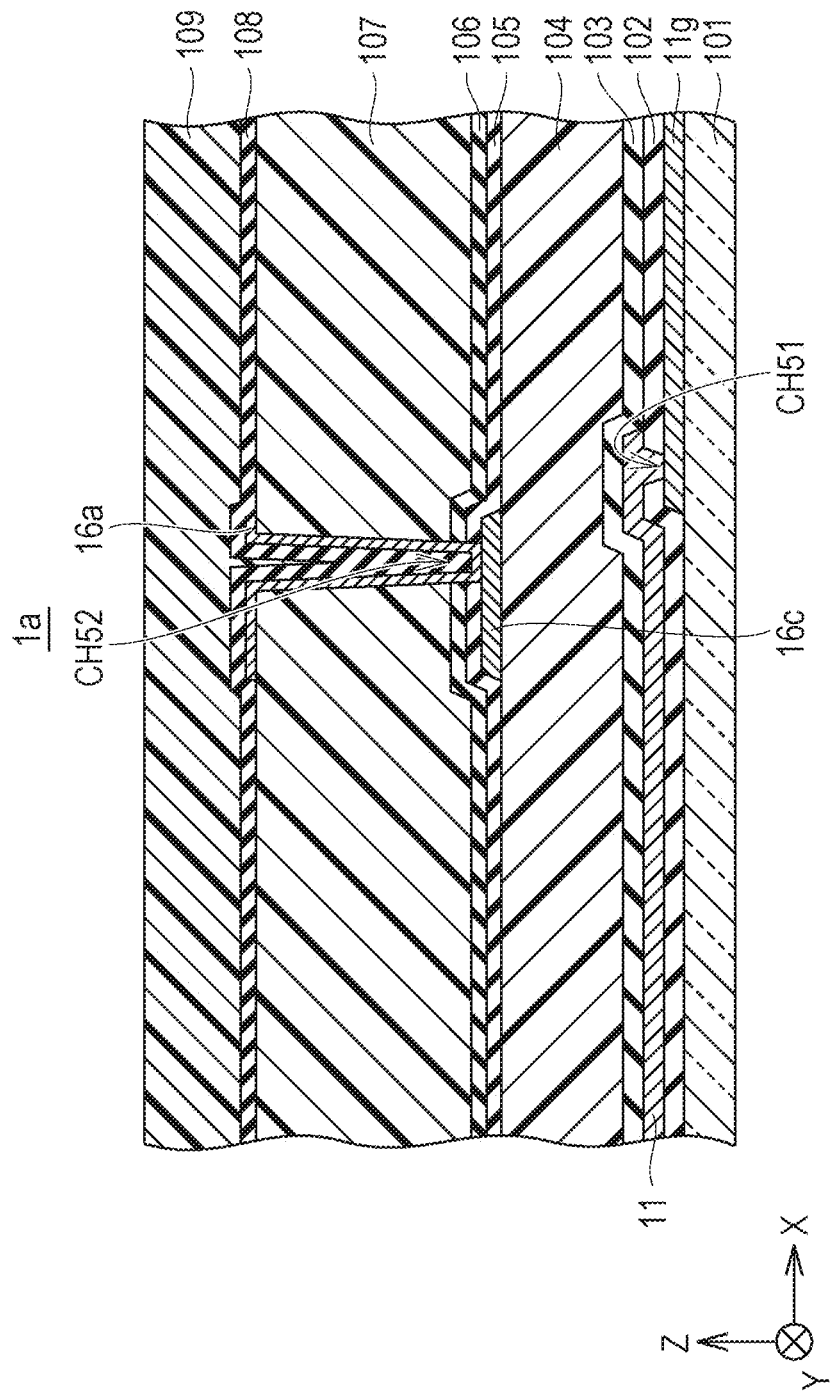
FIG. 4C is a schematic sectional view taken along line IVC-IVC in FIG. 3.
Figure 4D:
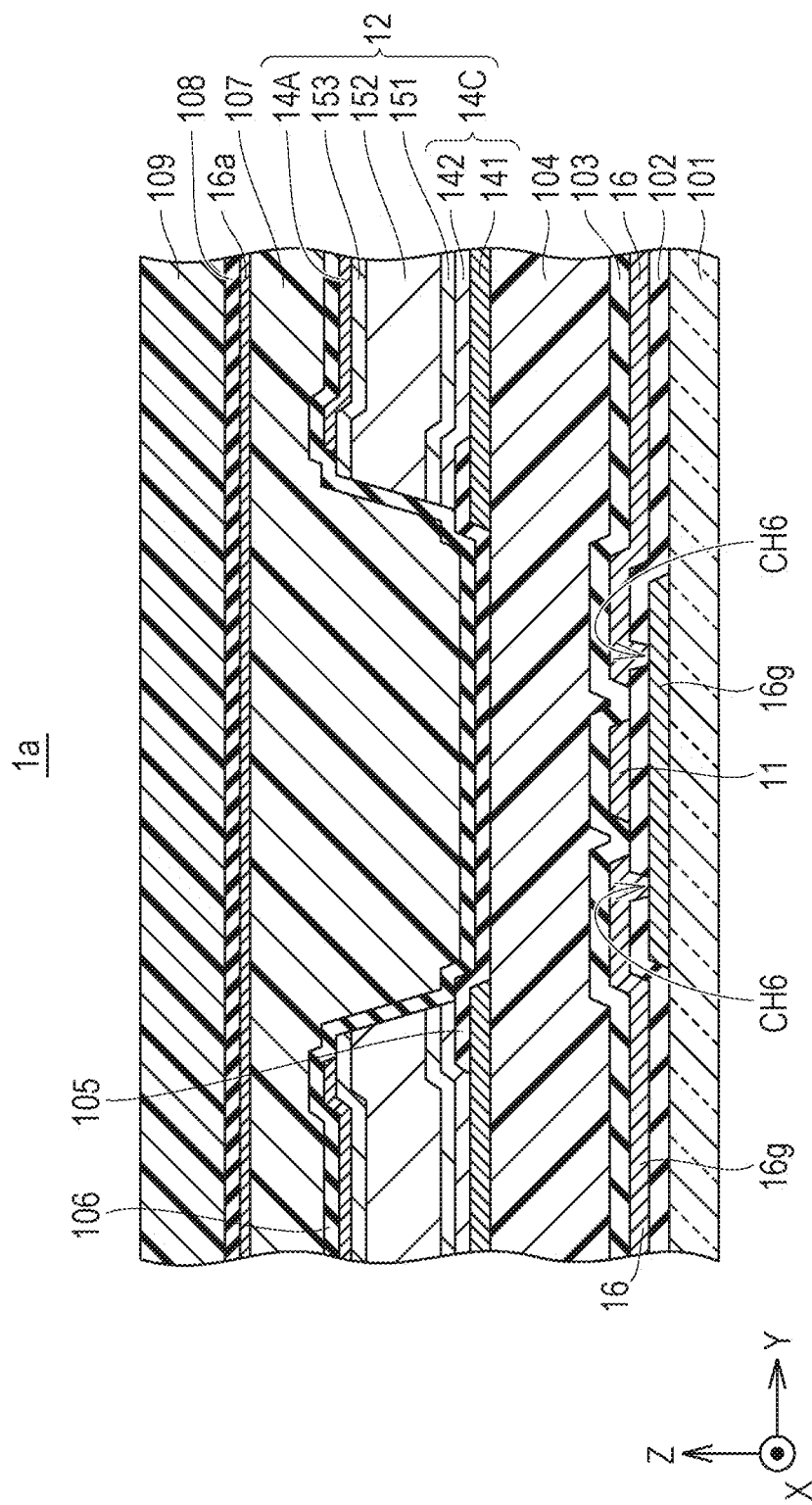
FIG. 4D is a schematic sectional view taken along line IVD-IVD in FIG. 3.

As illustrated in FIG. 4A, FIG. 4C, and FIG. 4D, the gate electrode 13a, the gate electrode wiring line 11g, a gate insulating film 102, and the connection wiring line 16g are disposed on a substrate 101 that has an insulating property such as a glass substrate. The gate electrode wiring line 11g is formed so as to be continuous with the gate electrode 13a as described above. A layer in which the gate electrode 13a, the gate electrode wiring line 11g, and the connection wiring line 16g are formed is referred to below as a gate layer.

The gate layer has a multilayer structure in which metal layers of tantalum nitride (TaN) and tungsten (W) are stacked in this order from a lower layer. The thicknesses of the layers of tantalum nitride (TaN) and tungsten (W) are preferably about 30 nm and 300 nm. The gate layer is not limited to the structure described above and may include a single layer or two or more layers. The material and thickness of the gate layer are not limited thereto.

The gate insulating film 102 covers the gate layer. As illustrated in FIG. 4C and FIG. 4D, the gate insulating film 102 is disposed so as to have spaces above the gate electrode wiring line 11g, and the contact holes CH51 and CH6 are consequently formed above the gate electrode wiring line 11g and the connection wiring line 16g. In this example, the gate insulating film 102 has a structure in which inorganic insulating films composed of silicon nitride ($SiN_x$) and silicon oxide ($SiO_2$) are stacked in this order from a lower layer. The thicknesses of the layers of silicon nitride ($SiN_x$) and silicon oxide ($SiO_2$) are preferably about 325 nm and 10 nm. The gate insulating film 102 is not limited to the structure described above and may include a single layer or two or more layers. The material and thickness of the gate insulating film 102 are not limited to the above description.

As illustrated in FIG. 4A to FIG. 4D, the semiconductor active layer 13b, the source electrode 13c, the drain electrode 13d, the gate wiring line 11, and the bias wiring line 16 are disposed on the gate insulating film 102. In this example, as illustrated in FIG. 3 and FIG. 4A, the source wiring line 10 is formed so as to be continuous with the source wiring line 13c, but it suffices that the source wiring line 10 and the source electrode 13c are electrically connected to each other. A layer in which the source electrode 13c, the drain electrode 13d, the source wiring line 10, the gate wiring line 11, and the bias wiring line 16 are disposed is referred to below as a source layer.

The semiconductor active layer 13b is in contact with the gate insulating film 102. The semiconductor active layer 13b is composed of oxide semiconductors. In this example, the semiconductor active layer 13b has a multilayer structure in which two layers of the oxide semiconductors containing indium (In), gallium (Ga), zinc (Zn), and oxygen (O) at predetermined ratios are stacked. The thicknesses of the two layers of the oxide semiconductors are preferably about 70 nm and 35 nm in this order from a lower layer.

In addition to the above description, examples of the oxide semiconductors used for the semiconductor active layer 13b may include $InGaO_3(ZnO)_5$, magnesium oxide zinc ($Mg_xZn_{1-x}O$), cadmium oxide zinc ($Cd_xZn_{1-x}O$), cadmium oxide (CdO), InSnZnO (containing In (indium), Sn (tin), and Zn (zinc)), an In (indium)-Al (aluminum)-Zn (zinc)-O (oxygen) semiconductor, and an amorphous oxide semiconductor containing indium (In), gallium (Ga), and zinc (Zn) at predetermined ratios. An "amorphous" material or a "crystalline (including polycrystal, fine crystal, and c-axis orientation)" material may be used as the oxide semiconductors. In the case where the semiconductor active layer 13b has a multilayer structure, any combination of above materials may be used.

The use of the oxide semiconductors described above results in a decrease in off-leakage current of the TFT 13 unlike the case of amorphous silicon (a-Si). The decrease in the off-leakage current of the TFT 13 results in a decrease in the off-leakage current of the photodiode 12, which improves QE (quantum efficiency) of the photodiode 12 and improves the sensitivity of X-ray detection.

The source electrode 13c and the drain electrode 13d cover a part of the semiconductor active layer 13b and are disposed so as to be separated from each other above the semiconductor active layer 13b.

The source layer has a multilayer structure in which metal films of titanium (Ti), aluminum (Al), and titanium (Ti) are stacked in order. The thicknesses of the metal films are preferably about 30 nm, 400 nm, and 50 nm in this order from a lower film. The source layer is not limited to the structure described above and may have a single layer structure or a multilayer structure of two or more layers. The material and thickness of the source layer are not limited to the above description.

As illustrated in FIG. 4C, the gate wiring line 11 is connected to the gate electrode wiring line 11g with the contact hole CH51 interposed therebetween. The gate wiring line 11 is connected to the gate control unit 2A (see FIG. 2), and a scan voltage is applied from the gate control unit 2A. The scan voltage is applied to the gate electrode wiring line 11g via the gate wiring line 11, and the TFT 13 is turned on. As illustrated in FIG. 4D, the bias wiring lines 16 that interpose the gate wiring line 11 are connected to the connection wiring line 16g with the contact holes CH6 interposed therebetween. A bias voltage is applied to the bias wiring lines 16 by using a control circuit, not illustrated.

As illustrated in FIG. 4A to FIG. 4D, an insulating film 103 is disposed on the gate insulating film 102 so as to cover a part of the source layer, and a flattening film 104 is disposed on the insulating film 103. As illustrated in FIG. 4A and FIG. 4B, the insulating film 103 and the flattening film 104 are disposed so as to have spaces above the drain electrode 13d and the bias wiring line 16. The contact hole CH2 and a contact hole CH41 that extend through the insulating film 103 and the flattening film 104 are formed at positions at which the contact holes CH2 and CH41 overlap the drain electrode 13d and the bias wiring line 16 in a plan view.

In this example, the insulating film 103 includes an inorganic insulating film composed of silicon oxide ($SiO_2$). The thickness of the insulating film 103 is, for example, about 500 nm. The insulating film 103 is not limited to the structure described above and may include a single layer or two or more layers.

In this example, the flattening film 104 includes an organic insulating film composed of photosensitive resin. The thickness of the flattening film 104 is preferably about 2500 nm. The flattening film 104 is not limited to the structure described above.

The first cathode electrode 141 and the connection wiring line 16c are disposed on the flattening film 104. As illustrated in FIG. 4A, the first cathode electrode 141 is connected to the drain electrode 13d with the contact hole CH2 interposed therebetween. As illustrated in FIG. 4A and FIG. 4B, the connection wiring line 16c is connected to the bias wiring lines 16 with the contact hole CH41 interposed therebetween. A layer in which the first cathode electrode 141 and the connection wiring line 16c are disposed is referred below to as a first cathode electrode layer.

The first cathode electrode layer has a multilayer structure in which metal films of titanium (Ti), aluminum (Al), and titanium (Ti) are stacked in order. The thicknesses of the metal films are preferably about 30 nm, 300 nm, and 100 nm in this order from a lower film. The first cathode electrode layer is not limited to the structure described above and may have a multilayer structure in which metal films are stacked. The thickness of the first cathode electrode layer is not limited to the above description.

An insulating film 105 that covers a part of the first cathode electrode layer is disposed on the flattening film 104. As illustrated in FIG. 4A, the insulating film 105 is disposed so as to have spaces above the first cathode electrode 141 and the connection wiring line 16c.

In this example, the insulating film 105 is an inorganic insulating film composed of silicon nitride (SiN). The thickness of the insulating film 105 is preferably about 300 nm. The insulating film 105 is not limited to the structure described above and may have a multilayer structure in which inorganic insulating films are stacked. The material and thickness of the insulating film 105 are not limited to the above description.

As illustrated in FIG. 4A and FIG. 4D, a second cathode electrode 142 is disposed on the first cathode electrode 141. The second cathode electrode 142 is disposed so as to overlap the insulating film 105 on the first cathode electrode 141 and is in contact with the first cathode electrode 141.

In this example, the second cathode electrode 142 is a metal film composed of titanium (Ti). The thickness of the second cathode electrode 142 is preferably about 30 nm. The second cathode electrode 142 is not limited to the structure described above and may have a multilayer structure in which metal films are stacked. The thickness of the second cathode electrode 142 is not limited to the above description.

According to the present embodiment, the first cathode electrode 141 and the second cathode electrode 142 function as a cathode electrode 14C of the photodiode 12. The second cathode electrode 142 has a thickness less than that of the first cathode electrode 141 and is stacked together with the first cathode electrode 141 to decrease the resistivity of the cathode electrode 14C.

An n-type amorphous semiconductor layer 151, an intrinsic amorphous semiconductor layer 152, and a p-type amorphous semiconductor layer 153 are stacked in order on the second cathode electrode 142. The semiconductor layers function as a photoelectric conversion layer of the photodiode 12.

The n-type amorphous semiconductor layer 151 is composed of amorphous silicon doped with n-type impurities (for example, phosphorus).

The intrinsic amorphous semiconductor layer 152 is composed of intrinsic amorphous silicon. The intrinsic amorphous semiconductor layer 152 is in contact with the n-type amorphous semiconductor layer 151.

The p-type amorphous semiconductor layer 153 is composed of amorphous silicon doped with p-type impurities (for example, boron). The p-type amorphous semiconductor layer 153 is in contact with the intrinsic amorphous semiconductor layer 152.

In this example, the thicknesses of the n-type amorphous semiconductor layer 151, the intrinsic amorphous semiconductor layer 152, and the p-type amorphous semiconductor layer 153 are preferably about 10 nm, 1200 nm, and 10 nm. The dopants and thicknesses of the n-type amorphous semiconductor layer 151, the intrinsic amorphous semiconductor layer 152, and the p-type amorphous semiconductor layer 153 are not limited to the above description.

An anode electrode 14A is disposed on the p-type amorphous semiconductor layer 153. The length of the anode electrode 14A in the X-axis direction is less than that of the photoelectric conversion layer. An example of the anode electrode 14A is a transparent conductive film composed of ITO (Indium Tin Oxide). The thickness of the anode electrode 14A is preferably about 60 nm. The material and thickness of the anode electrode 14A are not limited to the above description.

An insulating film 106 is disposed on the insulating films 105 so as to cover the surface of the photodiode 12, and a flattening film 107 is disposed above the insulating film 106.

As illustrated in FIG. 4A, the insulating film 106 and the flattening film 107 have a space at a position at which the insulating film 106 and the flattening film 107 overlap the anode electrode 14A in a plan view, and the contact hole CH3 is consequently formed. In FIG. 4A, the insulating films 105 and 106 and the flattening film 107 have a space at a position at which the insulating films 105 and 106 and the flattening film 107 overlap the connection wiring line 16c in a plan view, and the contact hole CH42 is consequently formed. As illustrated in FIG. 4C, the insulating films 105 and 106 and the flattening film 107 have a space at a position at which the insulating films 105 and 106 and the flattening film 107 overlap the connection wiring line 16c in a plan view, and the contact hole CH52 is consequently formed. That is, the contact holes CH42 and CH52 extend through the insulating films 105 and 106 and the flattening film 107.

In this example, the insulating film 106 is an inorganic insulating film composed of silicon nitride (SiN). The thickness of the insulating film 106 is preferably about 300 nm. The material and thickness of the insulating film 106 are not limited to the above description.

In this example, the flattening film 107 is an organic insulating film composed of photosensitive resin. The thickness of the flattening film 107 is preferably about 2500 nm. The structure of the flattening film 107 is not limited to the structure described above.

The connection wiring line 16a is disposed on the flattening film 107. As illustrated in FIG. 4A and FIG. 4C, the connection wiring line 16a is connected to the anode electrode 14A with the contact hole CH3 interposed therebetween. The connection wiring line 16a is connected to the connection wiring line 16c with the contact hole CH42 and the contact hole CH52 interposed therebetween. Consequently, the connection wiring line 16a that is connected to the photodiode 12 is connected to the bias wiring line 16 with the connection wiring line 16c interposed therebetween. The bias voltage is applied to the bias wiring line 16, and the bias voltage is applied to the anode electrode 14A of the photodiode 12 via the connection wiring lines 16c and 16a. According to the present embodiment, the connection wiring line 16a is composed of the same material as the anode electrode 14A and has the same thickness as the anode electrode 14A.

An insulating film 108 is disposed on the flattening film 107, and a flattening film 109 is disposed on the insulating film 108.

In this example, the insulating film 108 is an inorganic insulating film composed of silicon nitride (SiN). The thickness of the insulating film 108 is preferably about 400 nm. The structure of the insulating film 108 is not limited thereto.

In this example, the flattening film 109 is an organic insulating film composed of photosensitive resin. The thickness of the flattening film 109 is preferably about 3000 nm. The structure of the flattening film 109 is not limited thereto.

Sectional structures of each pixel of the active matrix substrate 1a are described above. The scintillator 1b (see FIG. 1) is disposed on the flattening film 109, and the imaging panel 1 is consequently formed although this is not illustrated.

Operation of X-Ray Imaging Apparatus 100

The operation of the X-ray imaging apparatus 100 illustrated in FIG. 1 will now be described. X-rays are radiated from the X-ray source 3. At this time, the control unit 2 applies a predetermined voltage (the bias voltage) to the bias wiring lines 16 (see, for example, FIG. 3). The X-rays that are radiated from the X-ray source 3 pass through the object S and enter the scintillator 1b. The X-rays that enter the scintillator 1b are converted into fluorescence (the scintillation light), and the scintillation light enters the active matrix substrate 1a. The scintillation light that enters the photodiodes 12 that are included in the pixels of the active matrix substrate 1a is converted into the electric charges depending on the amount of the scintillation light by using the photodiodes 12. Signals depending on the electric charges that are converted by the photodiodes 12 are outputted from the gate control unit 2A via the gate wiring lines 11 by using the TFTs 13 (see, for example, FIG. 2 and FIG. 3). During the state of ON depending on a gate voltage (a plus voltage), the signals pass through the source wiring lines 10 and are read by the signal-reading portion 2B (see, for example, FIG. 2). An X-ray image depending on the read signals is generated by the control unit 2.

Manufacturing Method

A method of manufacturing the active matrix substrate 1a according to the present embodiment will now be described with reference to FIG. 5A to FIG. 5J. FIG. 5A to FIG. 5J are sectional views illustrating processes for manufacturing the active matrix substrate 1a and illustrate sections taken along line VA-VA to line VJ-VJ in FIG. 3A described above.

A process in FIG. 5A is first performed. Specifically, the TFTs 13 are formed on the substrate 101 by using a known method. In the process for forming the TFTs 13, a metal film containing the material of the gate electrodes 13a is formed on the substrate 101, and predetermined patterning is subsequently performed.

Consequently, the gate electrodes 13a, the gate electrode wiring lines 11g (see FIG. 3 and FIG. 4C), and the connection wiring lines 16g (see FIG. 4D) are obtained. That is, the process forms the gate layer in which the gate electrodes 13a, the gate electrode wiring lines 11g, and the connection wiring lines 16g are formed.

Subsequently, the gate insulating films 102 in which silicon nitride ($SiN_x$) and silicon oxide ($SiO_2$) are stacked in order are formed so as to cover the gate layer by using, for example, a plasma CVD (Chemical Vapor Deposition) method, and patterning is subsequently performed.

Consequently, the contact holes CH6 (see FIG. 4D) are formed in the gate insulating films 102 at positions at which the contact holes CH6 overlap the connection wiring lines 16g in a plan view although this is not illustrated in FIG. 5A.

Subsequently, a metal film containing the materials of the source electrodes 13c and the drain electrodes 13d is formed on the gate insulating films 102, and patterning is subsequently performed to form the source electrodes 13c and the drain electrodes 13d. Consequently, the source electrodes 13c, the drain electrodes 13d, the source wiring lines 10, the gate wiring lines 11 (see FIG. 4B and FIG. 4C), and the bias wiring lines 16 are formed. That is, this process forms the source layer in which the source electrodes 13c, the drain electrodes 13d, the source wiring lines 10, and the gate wiring lines 11 are formed.

Subsequently, the insulating films 103 composed of silicon oxide ($SiO_2$) are formed on the source layer by using, for example, a plasma CVD method. A photolithography method and dry etching are performed, and the insulating films 103 are pattered. Consequently, openings 103a and 103b of the insulating films 103 are formed at positions at which the openings 103a and 103b overlap the bias wiring lines 16 and the drain electrodes 13d in a plan view (see FIG. 5B). This process forms the openings of the insulating films 103 for forming the contact holes CH41 (see FIG. 4B) above the bias wiring lines 16 that interpose the gate wiring lines 11 although this is not illustrated.

Subsequently, the flattening films 104 composed of photosensitive resin film are formed on the insulating films 103 by using, for example, the photolithography method. Consequently, the contact holes CH2 and CH41 are formed at positions at which the contact holes CH2 and CH41 overlap the drain electrodes 13d and the bias wiring lines 16 in a plan view (see FIG. 5C). This process forms the contact holes CH41 at positions at which the contact holes CH41 overlap the bias wiring lines 16 that interpose the gate wiring lines 11 in a plan view (see FIG. 4B) although this is not illustrated.

Subsequently, metal films of titanium (Ti), aluminum (Al), and titanium (Ti) are formed in order on the flattening film 104 by using, for example, a spattering method. Subsequently, the photolithography method and wet etching are performed, the metal films are patterned, and the first cathode electrodes 141 and the connection wiring lines 16c are consequently formed (see FIG. 5D). That is, the first cathode electrode layer in which the first cathode electrodes 141 and the connection wiring lines 16c are formed is consequently formed. The first cathode electrodes 141 are connected to the drain electrodes with the contact holes CH2 interposed therebetween. The connection wiring lines 16c are connected to the bias wiring lines 16 with the contact holes CH41 interposed therebetween.

Subsequently, the insulating films 105 composed of silicon nitride ($SiN_x$) are formed by using, for example, the plasma CVD method. Subsequently, the insulating films 105 are patterned by performing the photolithography method and the dry etching. Consequently, openings 105a and 105b of the insulating films 105 are formed at positions at which the openings 105a and 105b overlap the first cathode electrodes 141 and the connection wiring lines 16c in a plan view (see FIG. 5E).

Figure 5E:
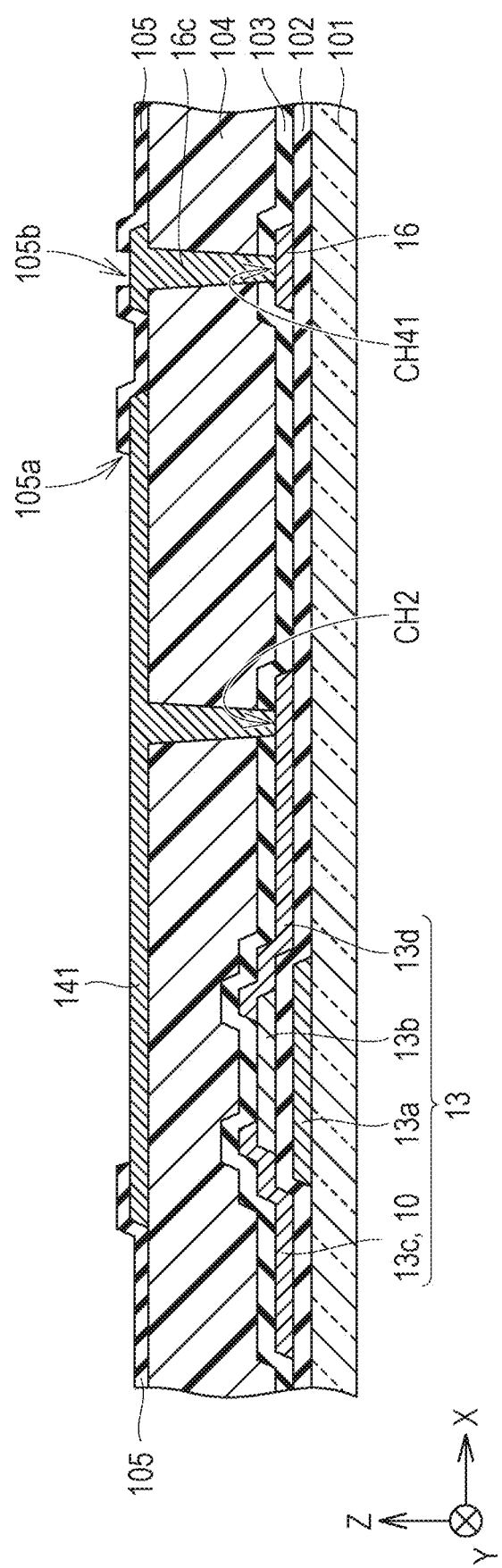
FIG. 5E is a sectional view illustrating a state in which insulating films 105 are formed after a process in FIG. 5D.
Figure 5F:
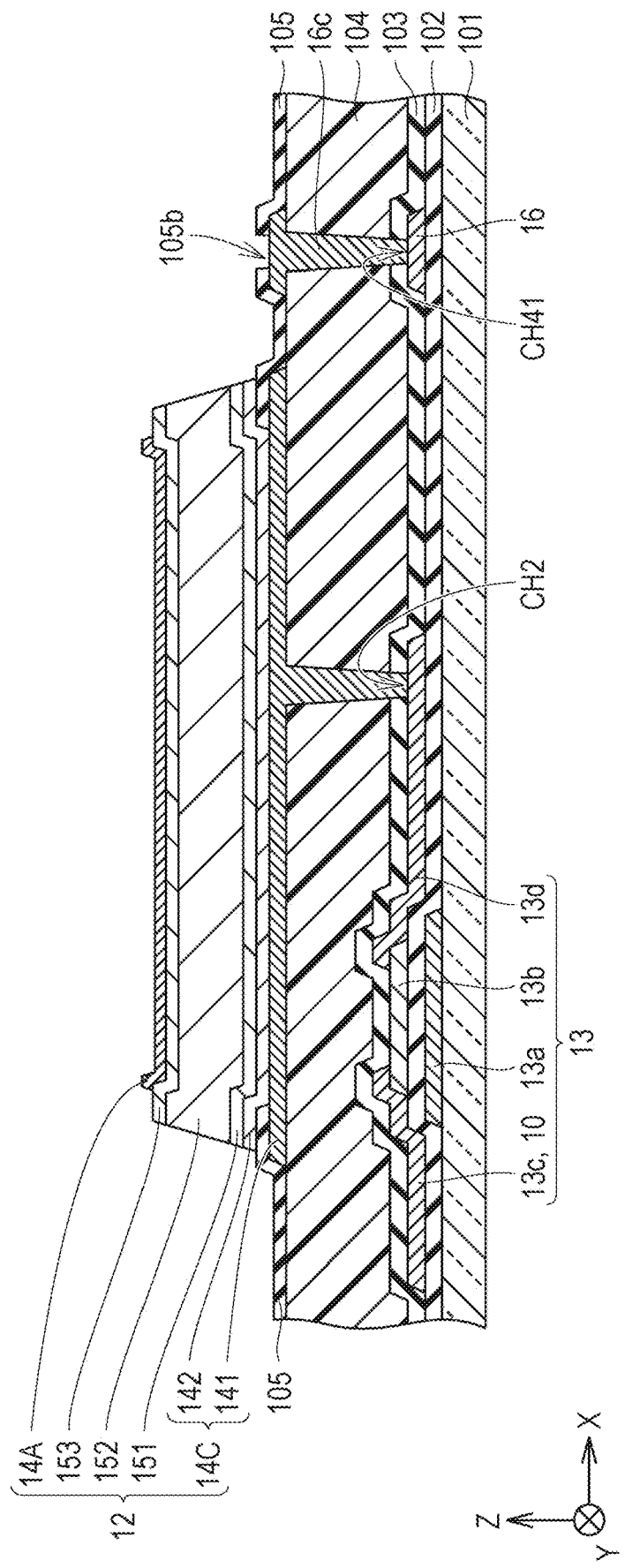
FIG. 5F is a sectional view illustrating a state in which photodiodes 12 are formed after a process in FIG. 5E.

Subsequently, a process illustrated in FIG. 5F is performed, and the photodiodes 12 are formed. Specifically, a metal film composed of titanium (Ti) is formed on the insulating films 105 by using, for example, the spattering method. The metal film is patterned by performing the photolithography method and the wet etching. Consequently, the second cathode electrodes 142 are formed at positions at which the second cathode electrodes 142 overlap the first cathode electrodes 141 in a plan view, and the cathode electrodes 14C that include the first cathode electrodes 141 and the second cathode electrodes 142 are formed. Subsequently, the n-type amorphous semiconductor layers 151, the intrinsic amorphous semiconductor layers 152, and the p-type amorphous semiconductor layers 153 are formed in order by using, for example, the plasma CVD method. A transparent conductive film composed of ITO, for example, is formed on the p-type amorphous semiconductor layers 153, and the transparent conductive film is patterned by performing the photolithography method and the dry etching. Consequently, the anode electrodes 14A are formed on the p-type amorphous semiconductor layers 153. Subsequently, the p-type amorphous semiconductor layers 153, the intrinsic amorphous semiconductor layers 152, and the n-type amorphous semiconductor layers 151 are patterned by performing the photolithography method and the dry etching, and the photoelectric conversion layers of the photodiodes 12 are formed.

Subsequently, the insulating films 106 composed of silicon nitride ($SiN_x$) are formed so as to cover the surfaces of the photodiodes 12 by using, for example, the plasma CVD method. The insulating films 106 are patterned by performing the photolithography method and the dry etching. Consequently, openings 106a and 106b of the insulating films 106 are formed at positions at which the openings 106a and 106b overlap the anode electrodes 14A and the openings 105b of the insulating films 105 in a plan view (see FIG. 5G).

Subsequently, the flattening films 107 composed of acrylic resin are applied by using, for example, a slit coating method, and the flattening films 107 are patterned by performing the photolithography method and the dry etching. Consequently, the contact holes CH3 and the contact holes CH42 are formed at positions at which the contact holes CH3 and the contact holes CH42 overlap the anode electrodes 14A and the connection wiring lines 16c in a plan view (see FIG. 5H). The contact holes CH3 extend through the insulating films 106 and the flattening films 107 above the anode electrodes 14A. The contact holes CH42 extend through the insulating films 105, the insulating films 106, and the flattening films 107 above the connection wiring lines 16c. This process forms the contact holes CH52 above the connection wiring lines 16c at positions at which the contact holes CH52 overlap parts of the gate wiring lines 11 in a plan view (see FIG. 4C) although this is not illustrated. The contact holes CH52 extend through the insulating films 105, the insulating films 106, and the flattening films 107 above the connection wiring lines 16c.

Subsequently, a transparent conductive film composed of ITO is formed on the flattening films 107 by using, for example, the spattering method, and the transparent conductive film is pattered by the photolithography method and the dry etching. Consequently, the connection wiring lines 16a that are connected to the anode electrodes 14A at the contact holes CH3 and that are connected to the connection wiring lines 16c at the contact holes CH42 are formed (see FIG. 5I).

Subsequently, the insulating films 108 composed of silicon nitride ($SiN_x$) are formed so as to cover the connection wiring lines 16a by using, for example, the plasma CVD method. The flattening films 109 composed of acrylic resin are formed on the insulating films 108 by using, for example, the slit coating method (see FIG. 5J).

The source wiring lines 10 and the gate wiring lines 11 are driven when the electric charges that are accumulated on the pixels are read. To improve the readout rate of the electric charges, the wiring lines preferably have low resistivity. The resistivity of the wiring lines can be decreased by increasing the thicknesses of the wiring lines. In the case where there are multiple wiring lines that are to have low resistivity, the thicknesses of the wiring lines are to be increased if the wiring lines are formed in different layers. According to the first embodiment described above, the source wiring lines 10 and the gate wiring lines 11 are formed in the same layer, and the resistivity of the gate wiring lines 11 and the source wiring lines 10 can be decreased by increasing the thicknesses thereof collectively. Consequently, costs for decreasing the resistivity of the wiring lines are lower than those in the case where the gate wiring lines 11 and the source wiring lines 10 are formed in different layers. According to the first embodiment described above, the bias wiring lines 16 are formed in the same layer as the gate wiring lines 11 and the source wiring lines 10, and the resistivity of the bias wiring lines 16 can also be decreased in addition to the gate wiring lines 11 and the source wiring lines 10.

According to the first embodiment described above, the source layer contains aluminum (Al) the resistivity of which is lower than that of tungsten (W) used for the gate layer. That is, the source layer is composed of a material the resistivity of which is lower than that of the gate layer. For this reason, the resistivity of the gate wiring lines 11 can be lower than that in the case where the gate wiring lines 11 are formed in the gate layer.

Second Embodiment

In an example described according to the above first embodiment, the bias wiring lines 16 are disposed in the same layer as the gate wiring lines 11 and the source wiring lines 10, but the layer in which the bias wiring lines 16 are formed is not limited thereto. In an example described according to the present embodiment, the bias wiring lines 16 are disposed in a layer that differs from that according to the first embodiment.

Figure 6:
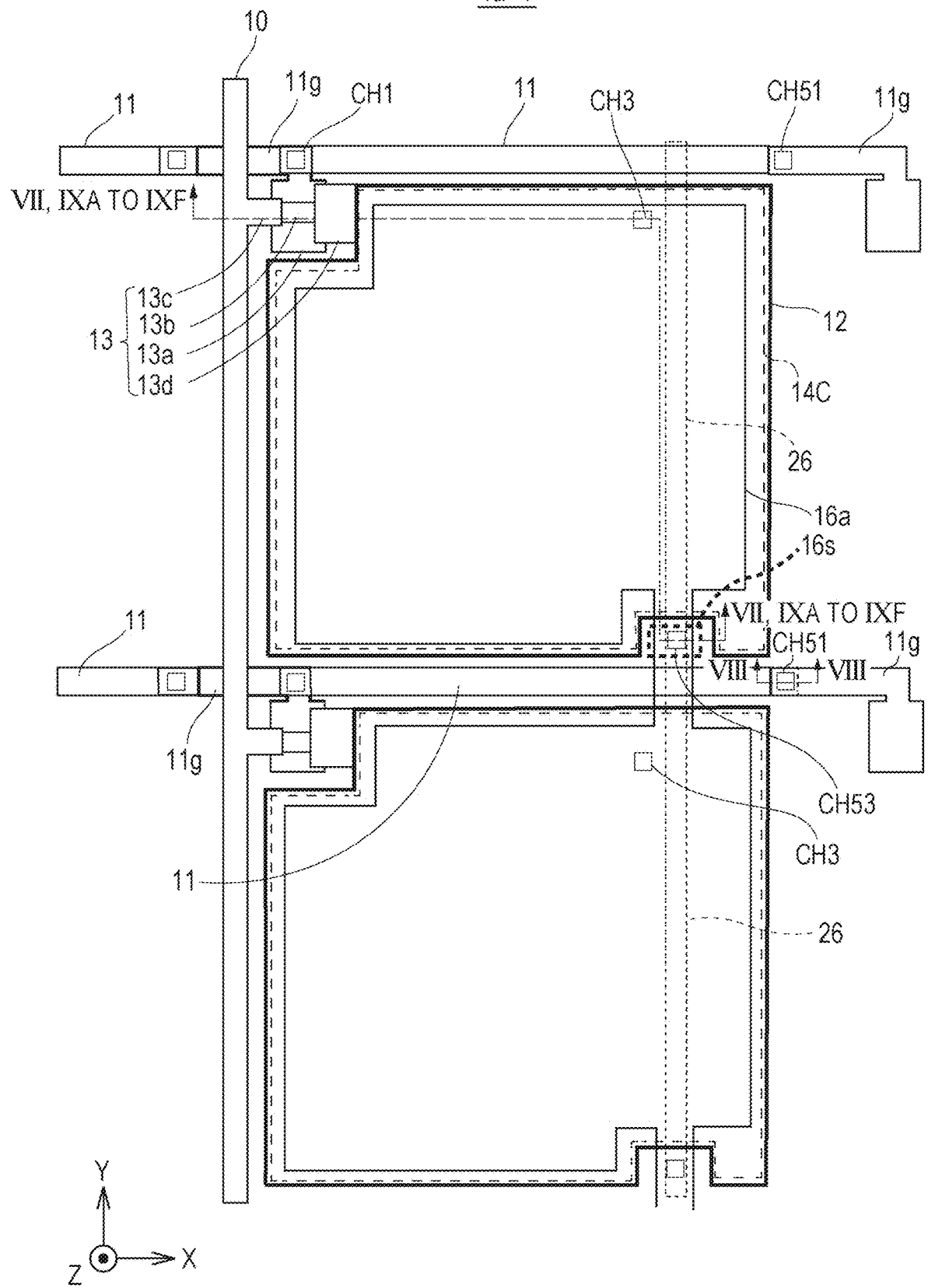
FIG. 6 is a schematic plan view of pixels of an active matrix substrate according to a second embodiment.
Figure 7:
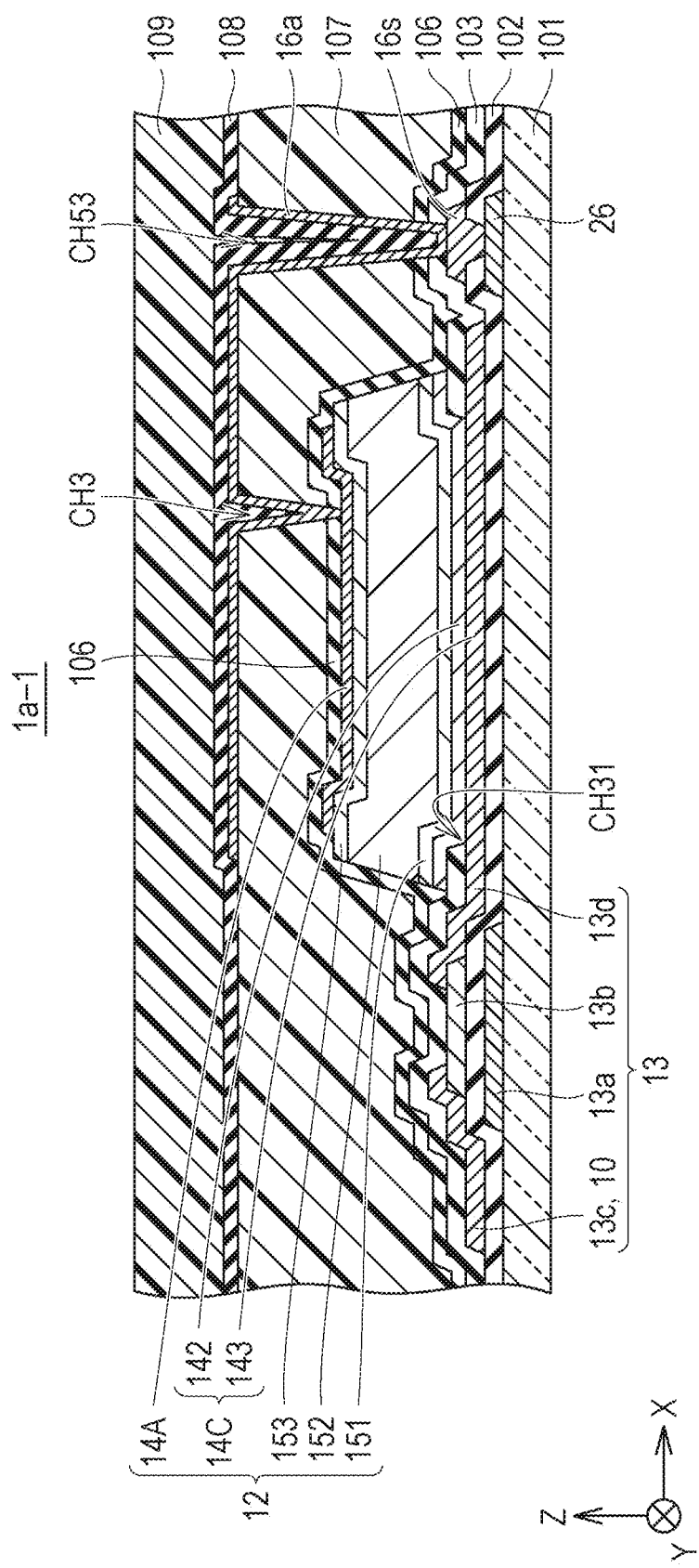
FIG. 7 is a schematic sectional view taken along line VII-VII in FIG. 6.

FIG. 6 is a schematic plan view of pixels of an active matrix substrate according to the present embodiment. FIG. 7 and FIG. 8 are schematic sectional views taken along line VII-VII and line VIII-VIII in FIG. 6. In FIG. 6 to FIG. 8, components like to those according to the first embodiment are designated by reference characters like to those according to the first embodiment.

In an active matrix substrate 1a_1 according to the present embodiment, the gate wiring lines 11 and the source wiring lines 10 are disposed in the source layer as in the active matrix substrate 1a according to the first embodiment, and the gate wiring lines 11 are divided near the source wiring lines 10. For this reason, as illustrated in FIG. 8, the gate wiring lines 11 that are formed in the source layer are connected to the gate electrode wiring lines 11g with the contact holes CH51 of the gate insulating films 102 that cover the gate layer interposed therebetween. The gate wiring lines 11 that interpose the source wiring lines 10 are connected to each other by the gate electrode wiring lines 11g.

As illustrated in FIG. 6 and FIG. 7, an imaging panel 1b includes bias wiring lines 26 that are disposed so as to overlap the photodiodes 12 in a plan view and to be substantially parallel to the source wiring lines 10. The bias wiring lines 26 are disposed in the gate layer in which the gate electrodes 13a are formed.

As illustrated in FIG. 7, the gate insulating films 102 cover the gate electrodes 13a, are divided on the bias wiring lines 26, and cover parts of the bias wiring lines 26. The connection wiring lines 16s that are connected to the bias wiring lines 26 are disposed on the gate insulating films 102 at positions at which the connection wiring lines 16s overlap the bias wiring lines 26 in a plan view. The connection wiring lines 16s are disposed in the source layer as in the source electrodes 13c and the drain electrodes 13d.

According to the present embodiment, as illustrated in FIG. 6 and FIG. 7, the cathode electrodes 14C of the photodiodes 12 include the first cathode electrodes 143 that are continuous with the drain electrodes 13d and the second cathode electrodes 142. That is, according to the present embodiment, the source electrodes 13c, the drain electrodes 13d, source wiring lines 10, the gate wiring lines 11, the first cathode electrodes 143, and the connection wiring lines 16s are formed in the source layer.

The second cathode electrodes 142 cover parts of the insulating films 103 on the first cathode electrodes 143 and are connected to the first cathode electrodes 143 with the contact holes CH31 interposed therebetween. The photoelectric conversion layers (151 to 153) and the anode electrodes 14A are disposed on the second cathode electrodes 142 as in the first embodiment, and the insulating films 106 are disposed on the photodiodes 12 and the insulating films 103.

According to the present embodiment, the source electrodes 13c, the drain electrodes 13d, the source wiring lines 10, the gate wiring lines 11, and the first cathode electrodes 143 are formed in the source layer as described above. For this reason, the resistivity thereof can be decreased by increasing the thicknesses thereof in the processes for manufacturing the imaging panel 1b.

According to the first embodiment, the first cathode electrodes 141 are formed above the source layer, and the photodiodes 12 can be consequently formed so as to overlap the TFTs 13 in a plan view. According to the present embodiment, the first cathode electrodes 143 are formed in the source layer, and the photodiodes 12 are consequently formed so as not to overlap the TFTs 13 in a plan view. For this reason, according to the present embodiment, the area of each photodiode 12 is smaller than that according to the first embodiment. According to the present embodiment, however, the first cathode electrodes 143 are formed in the source layer, and a layer for forming the first cathode electrodes 141 is not formed unlike the first embodiment. Accordingly, the number of the layers of the imaging panel 1b according to the present embodiment is smaller than that of the imaging panel 1 according to the first embodiment, and the manufacturing costs of the imaging panel 1b are reduced.

A method of manufacturing the active matrix substrate 1a_1 according to the present embodiment will now be described with reference to FIG. 9A to FIG. 9F. FIG. 9A to FIG. 9F are sectional views illustrating processes for manufacturing the active matrix substrate 1a_1 and illustrate schematic sections taken along line IXA-IXA to line IXF-IXF illustrated in FIG. 6 described above. Manufacturing processes that differ from those according to the first embodiment will now be mainly described.

Figure 9A:
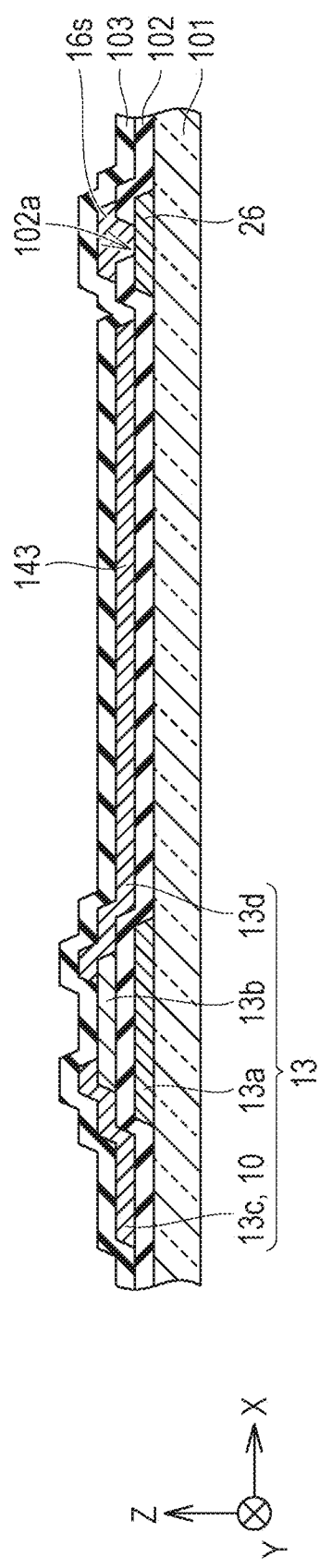
FIG. 9A is a sectional view illustrating a process for manufacturing the active matrix substrate according to the second embodiment and illustrates a state in which the TFTs 13, first cathode electrodes 143, the gate insulating films 102, connection wiring lines 16s, and the insulating films 103 are formed above the substrate.
Figure 9B:
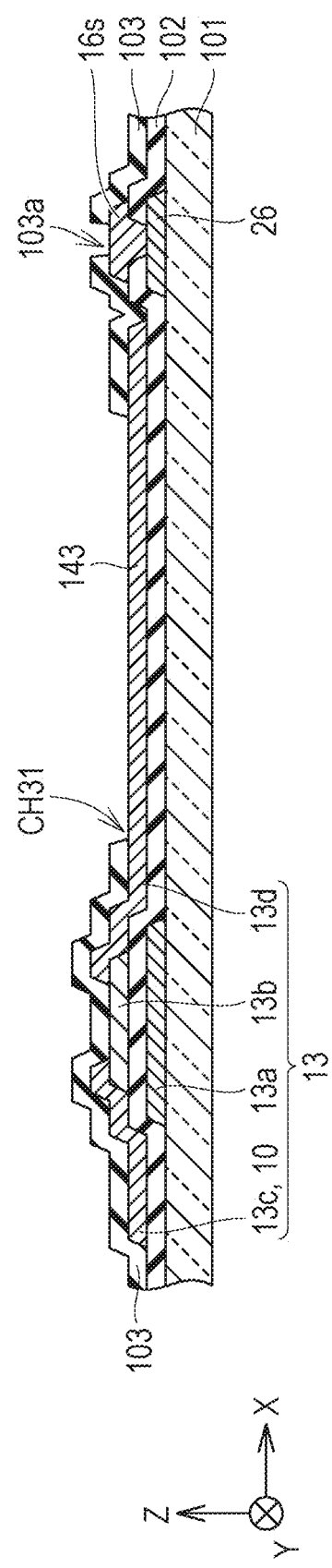
FIG. 9B is a sectional view illustrating a state in which an opening of each insulating film 103 is formed after the process in FIG. 9A.

A process in FIG. 9A is first performed. Specifically, metal films of tungsten (W) and tantalum nitride (TaN) are stacked on the substrate 101 by using, for example, the spattering method. The metal films are patterned by performing the photolithography method and the wet etching. Consequently, the gate electrodes 13a, the gate electrode wiring lines 11g (see FIG. 8) that are continuous with the gate electrodes 13a, and the bias wiring lines 26 are formed on the substrate 101.

Subsequently, the gate insulating films 102 in which silicon nitride ($SiN_x$) and silicon oxide ($SiO_2$) are stacked in order are formed on the gate electrodes 13a and the bias wiring lines 26 by using, for example, the plasma CVD method. The gate insulating films 102 are patterned by performing the photolithography method and the dry etching. Consequently, openings 102a of the gate insulating films 102 are formed at positions at which the openings 102a overlap the bias wiring lines 26 in a plan view.

Subsequently, two layers of oxide semiconductors containing indium (In), gallium (Ga), zinc (Zn), and oxygen (O) at predetermined ratios are stacked on the gate insulating films 102 by using, for example, the plasma CVD method. The oxide semiconductors are patterned by performing the photolithography method and the dry etching, and the semiconductor active layers 13b are formed at positions at which the semiconductor active layers 13b overlap the gate electrodes 13a in a plan view.

Subsequently, metal films of titanium (Ti), aluminum (Al), and titanium (Ti) are formed in order by using, for example, the spattering method. Subsequently, the metal films are patterned by performing the photolithography method and the wet etching, and the source layer is formed. Specifically, the source electrodes 13c and the drain electrodes 13d are formed as the source layer, and the source wiring lines 10 (see FIG. 6), the gate wiring lines 11 (see FIG. 6 and FIG. 8), the first cathode electrodes 143, and the connection wiring lines 16s are formed. The source wiring lines 10 are formed so as to be continuous with the source electrodes 13c, and the first cathode electrodes 143 are formed so as to be continuous with the drain electrodes 13d. The connection wiring lines 16s are connected to the bias wiring lines 26 at the openings 102a of the gate insulating films 102. Subsequently, the insulating films 103 composed of silicon oxide ($SiO_2$) are formed on the source layer by using, for example, the plasma CVD method.

Subsequently, the insulating films 103 are patterned by performing the photolithography method and the dry etching. Consequently, the contact holes CH31 and the openings 103a are formed at positions at which the contact holes CH31 and the openings 103a overlap the first cathode electrodes 143 and the connection wiring lines 16s in a plan view (see FIG. 9B).

Figure 9C:
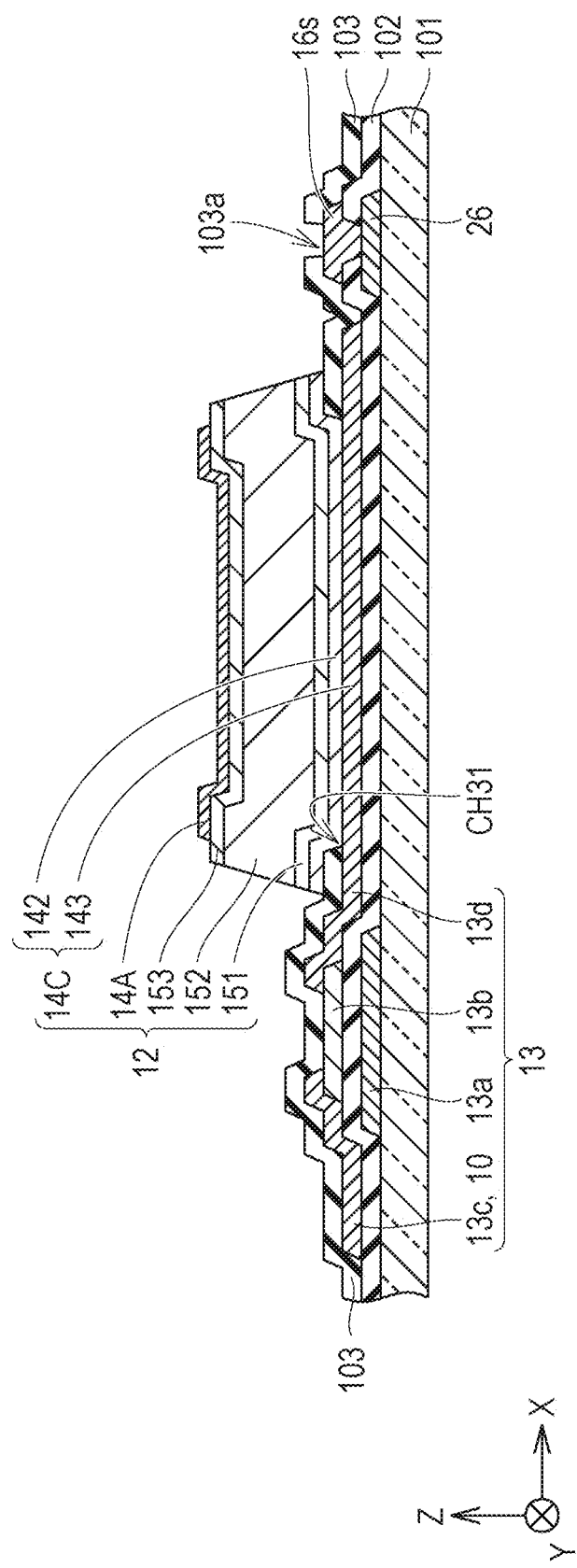
FIG. 9C is a sectional view illustrating a state in which the photodiodes 12 are formed after a process in FIG. 9B.
Figure 9D:
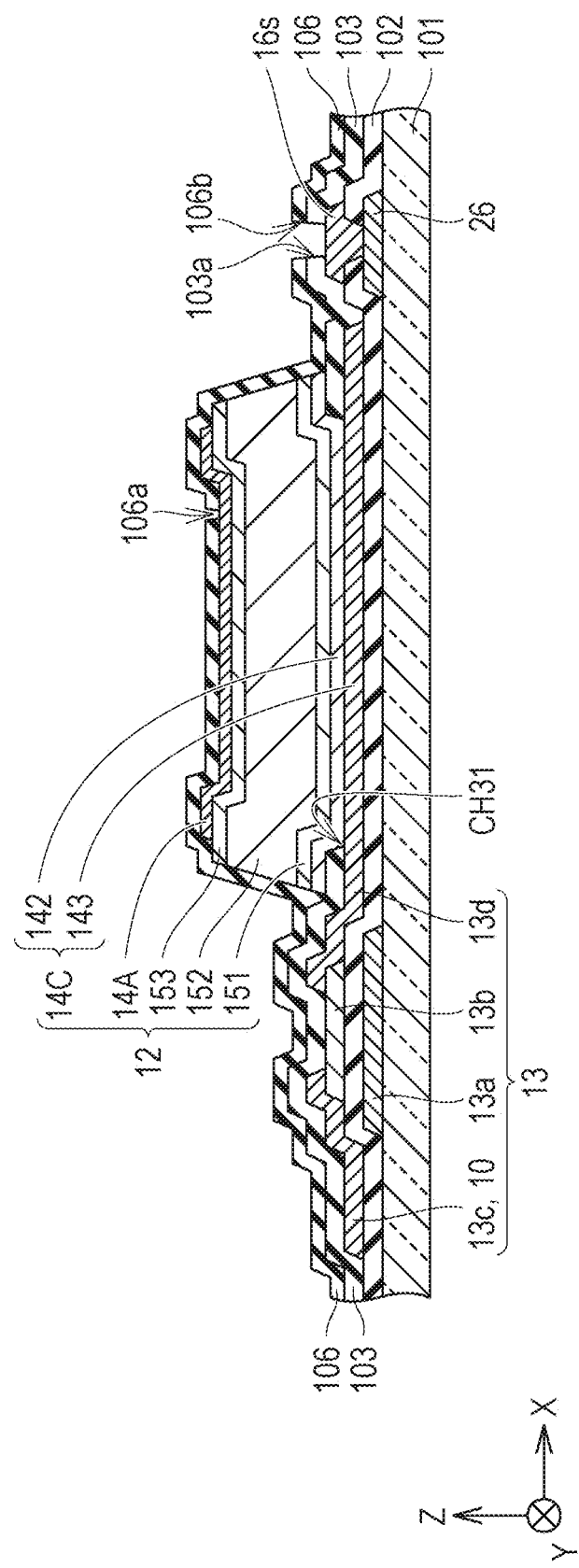
FIG. 9D is a sectional view illustrating a state in which the insulating films 106 are formed after a process in FIG. 9C.
Figure 9E:
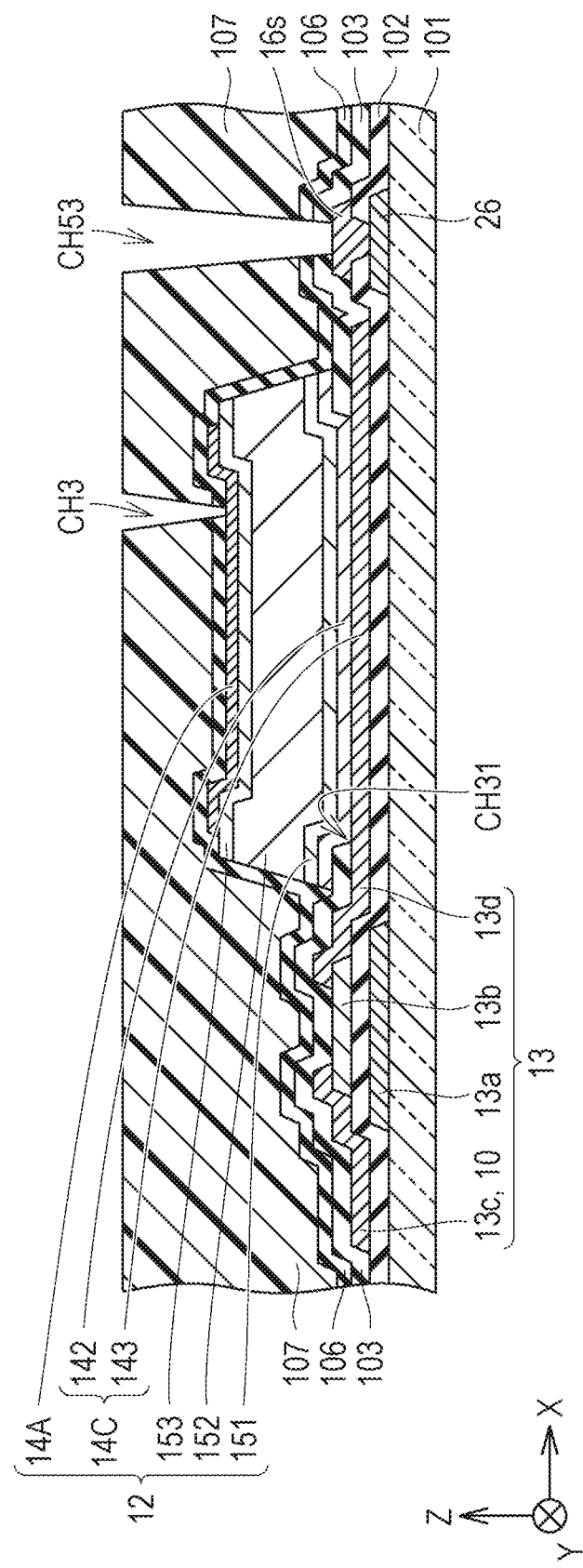
FIG. 9E is a sectional view illustrating a state in which the flattening films 107 are formed after a process in FIG. 9D.

Subsequently, the second cathode electrodes 142, the photoelectric conversion layers (151 to 153), and the anode electrodes 14A are formed in order by performing the same process as in the FIG. 5F described above, and the photodiodes 12 are manufactured (see FIG. 9C).

Figure 5G:
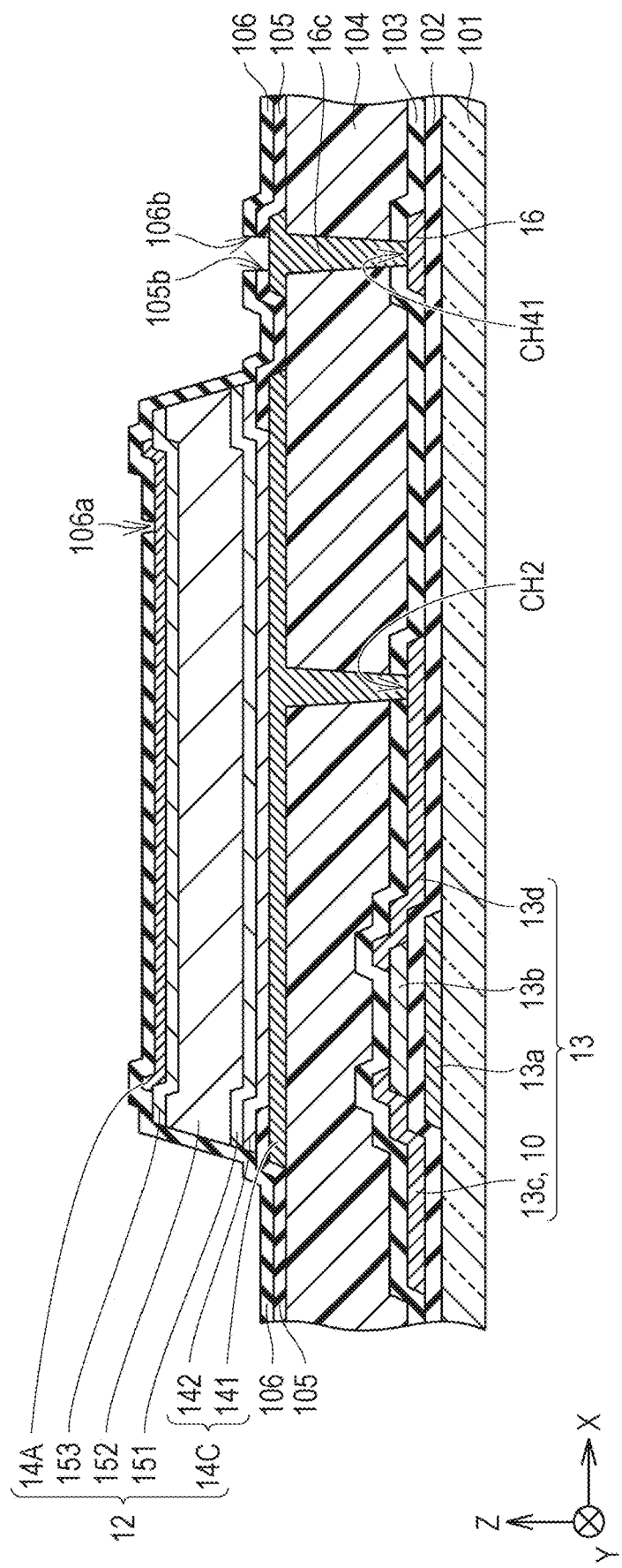
FIG. 5G is a sectional view illustrating a state in which insulating films 106 are formed after a process in FIG. 5F.

Subsequently, the insulating films 106 are formed on the insulating films 103 and the photodiodes 12 by performing the same process as in FIG. 5G described above. In this process, openings 106a of the insulating films 106 are formed at positions at which the openings 106a overlap the anode electrodes 14A in a plan view, and the openings 106b of the insulating films 106 are formed at positions at which the openings 106b overlap the openings 103a (see FIG. 9D).

Figure 5H:
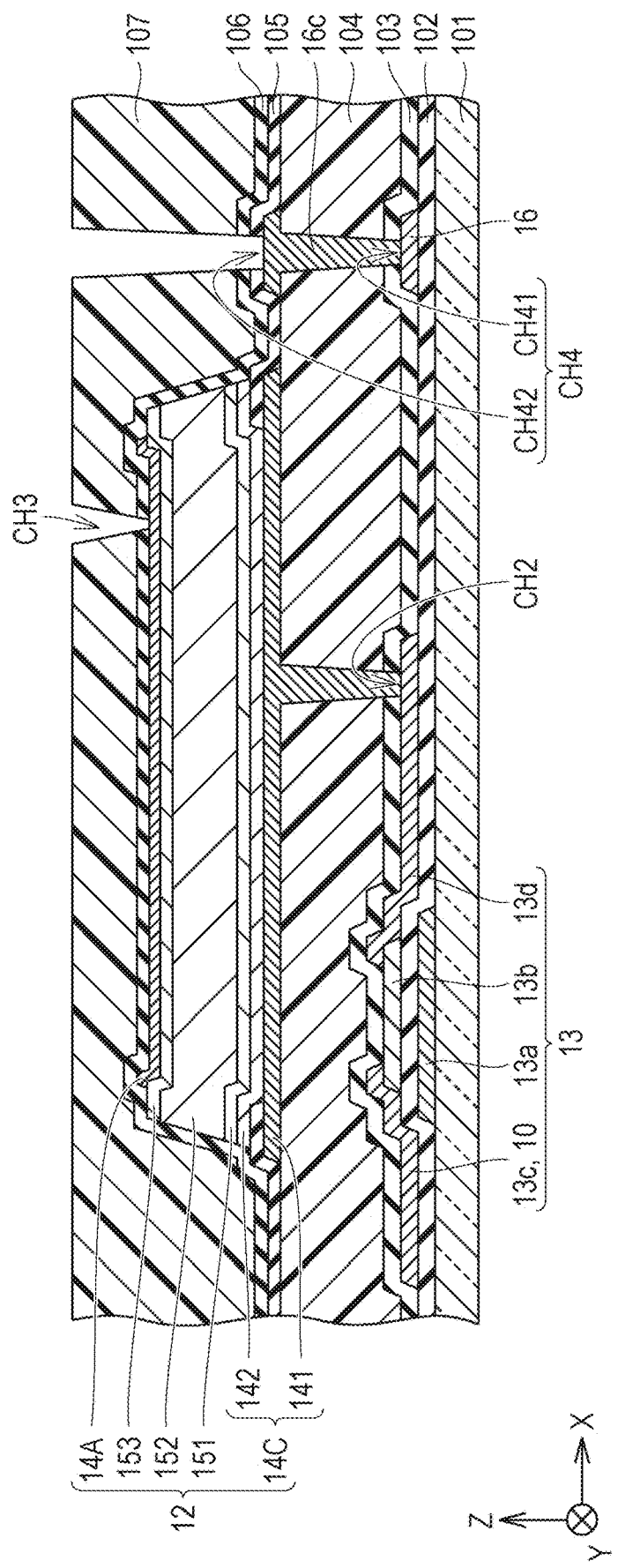
FIG. 5H is a sectional view illustrating a state in which flattening films 107 are formed after a process in FIG. 5G.

Subsequently, the flattening films 107 are formed on the insulating films 106 by performing the same process as in FIG. 5H described above. The contact holes CH3 and CH53 that extend through the flattening films 107 are formed at positions at which the contact holes CH3 and CH53 overlap the openings 106a and 106b (see FIG. 9E).

Figure 5I:
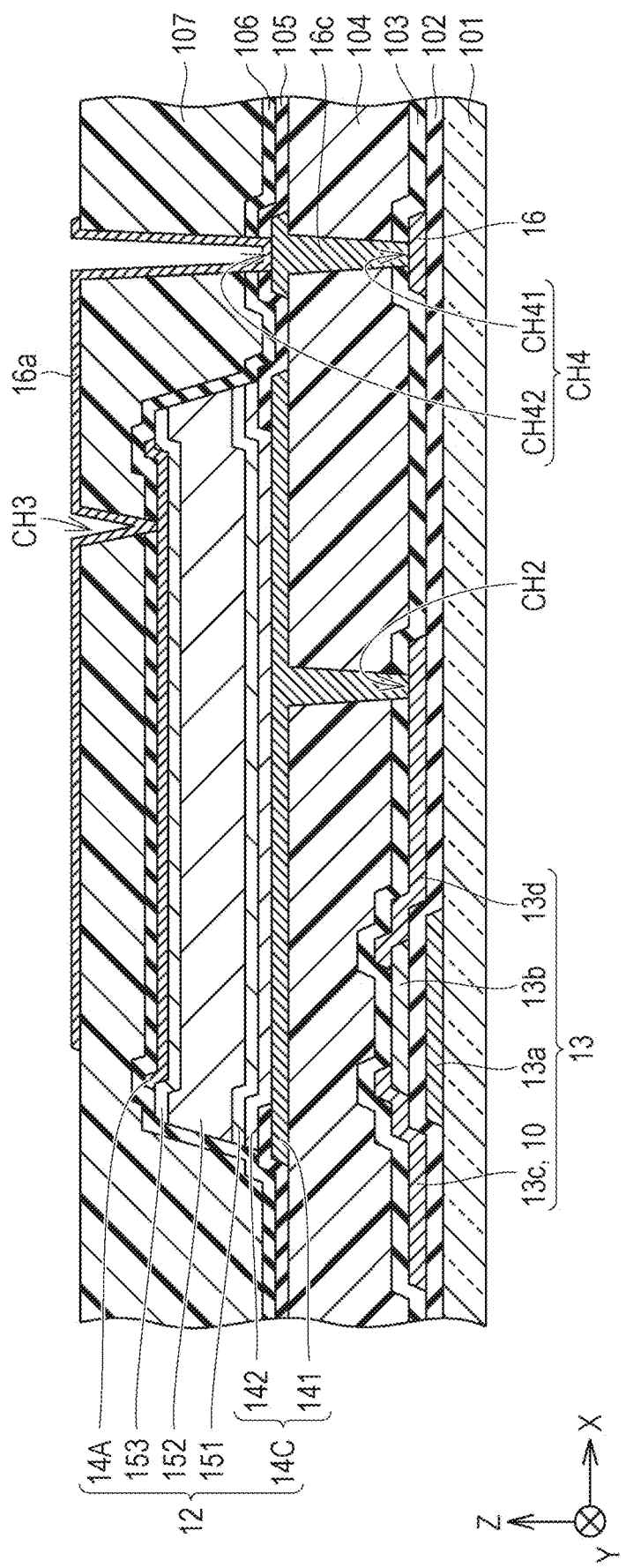
FIG. 5I is a sectional view illustrating a state in which connection wiring lines 16a are formed after a process in FIG. 5H.
Figure 5J:
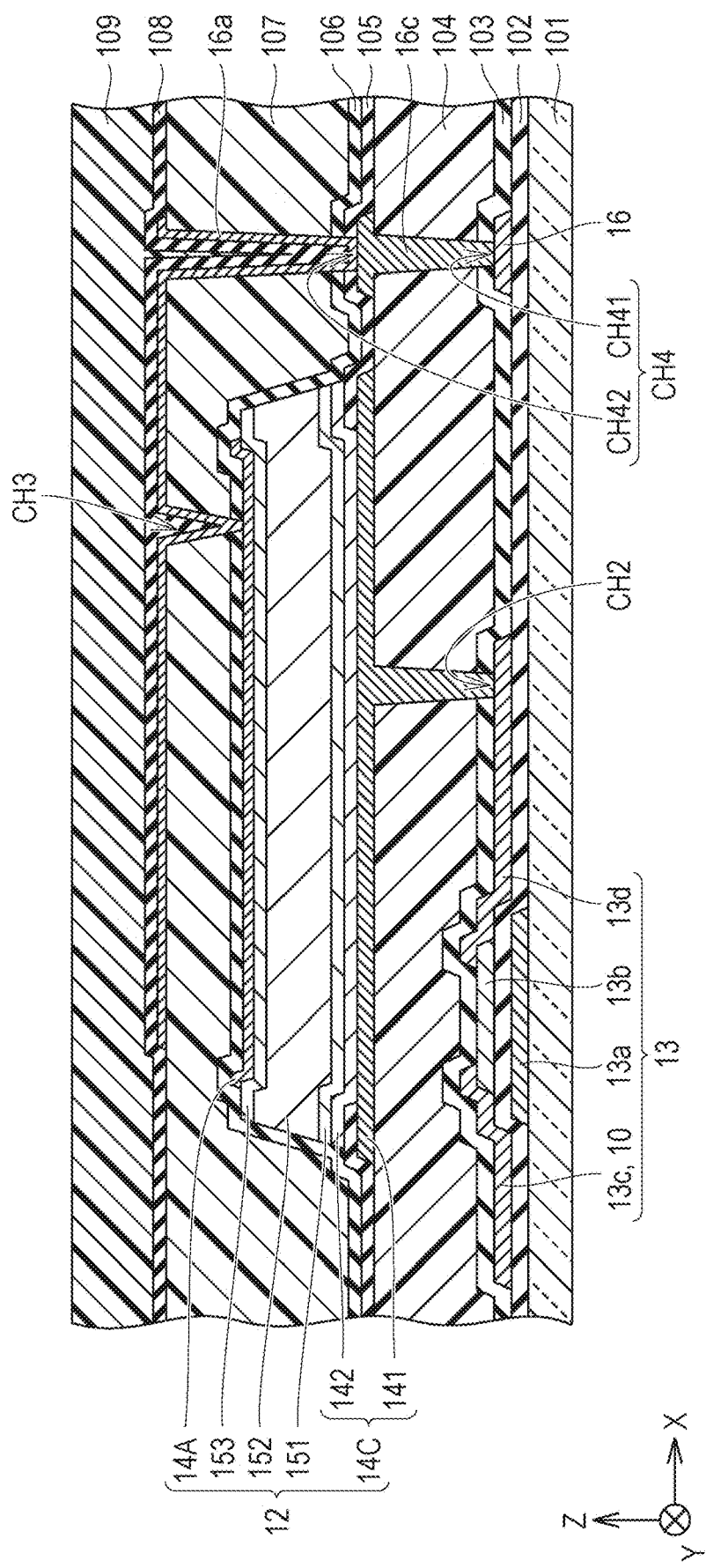
FIG. 5J is a sectional view illustrating a state in which insulating films 108 and flattening films 109 are formed after a process in FIG. 5I.
Figure 9F:
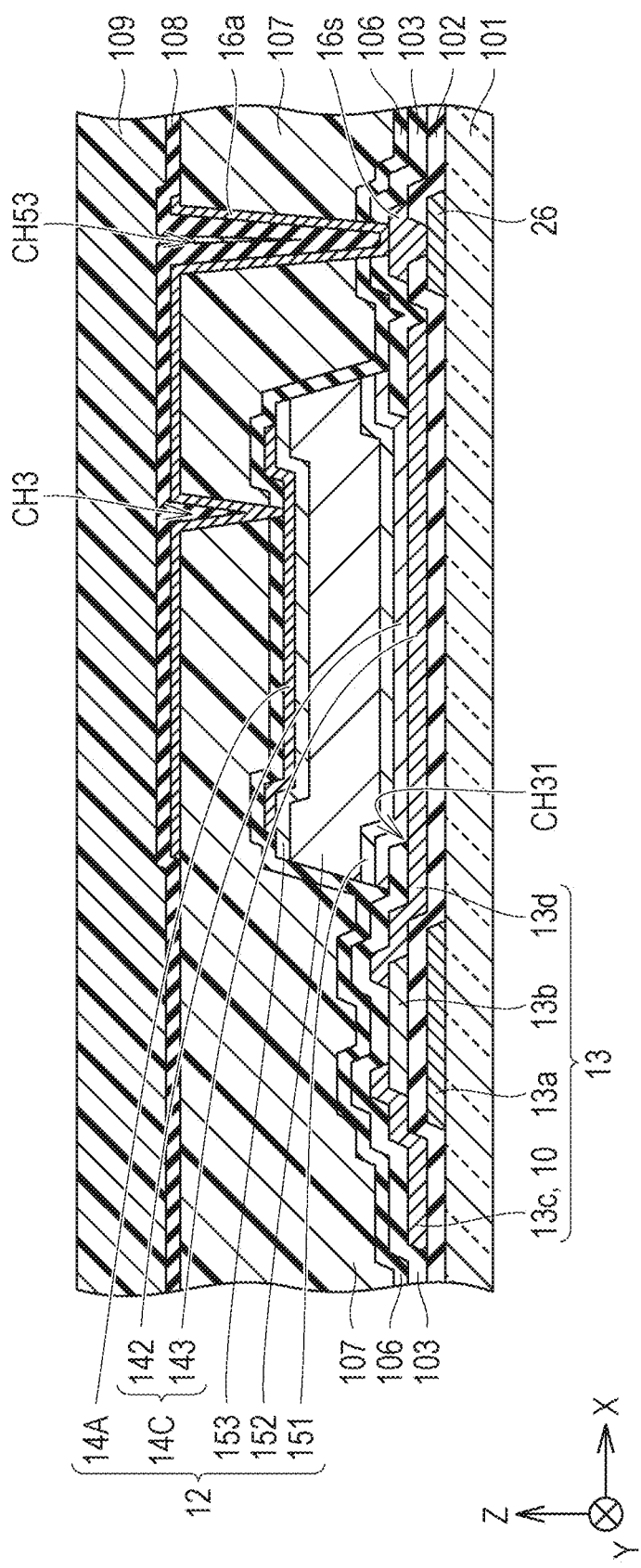
FIG. 9F is a sectional view illustrating a state in which connection wiring lines 16a, the insulating films 108, and the flattening films 109 are formed after a process in FIG. 9E.

Subsequently, the connection wiring lines 16a, the insulating films 108, and the flattening films 109 are formed in order by sequentially performing processes in FIGS. 5I and 5J described above, and the active matrix substrate 1a_1 is manufactured (see FIG. 9F).

The embodiments of the imaging panels are described above, but the embodiments described above are examples. Accordingly, the imaging panels are not limited to the embodiments described above, and the embodiments described above can be appropriately modified and carried out without departing from the spirit thereof.

Figure 10:
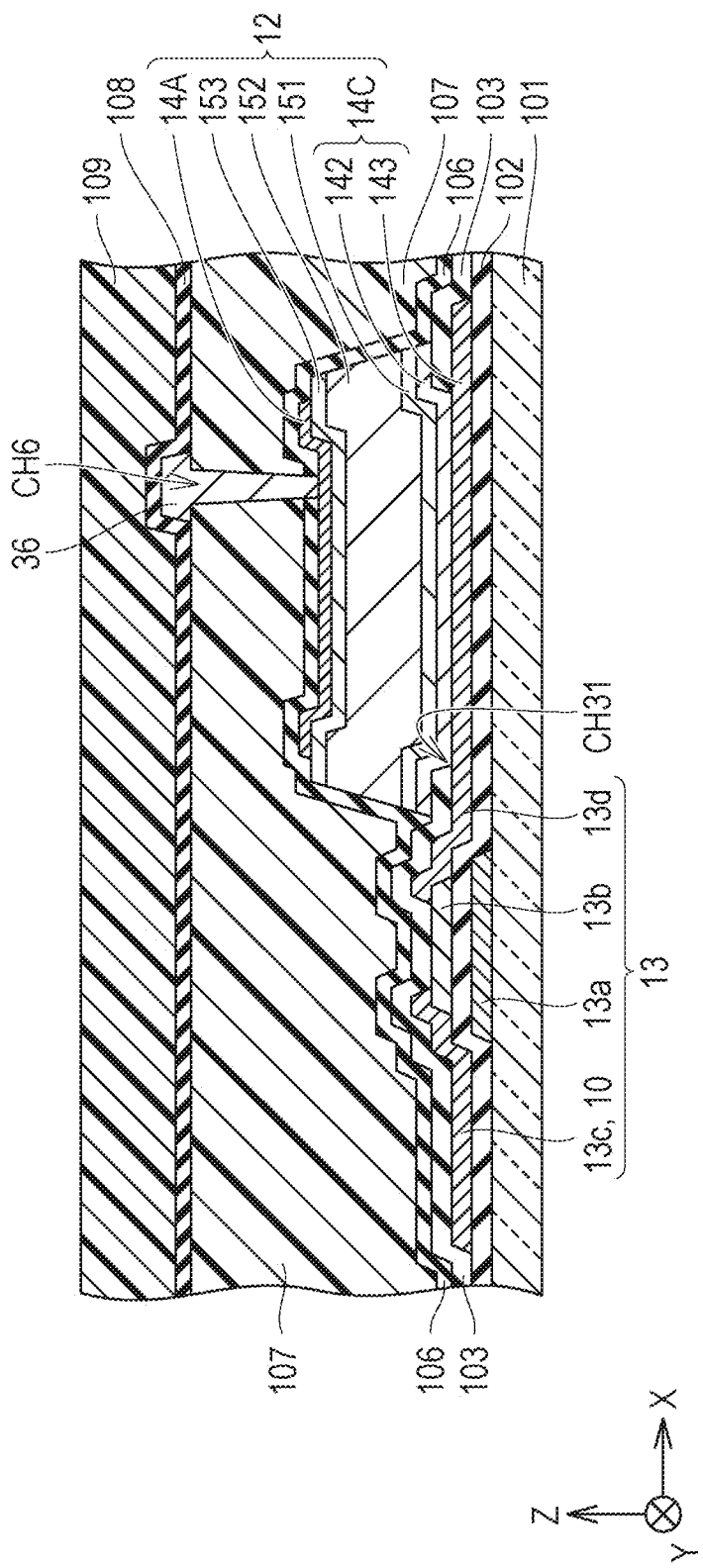
FIG. 10 is a schematic sectional view of pixels of an active matrix substrate according to a modification (1).

(1) In an example described according to the above second embodiment, the bias wiring lines 26 are disposed in the gate layer, but the layer in which the bias wiring lines are disposed is not limited thereto. FIG. 10 is a schematic sectional view of pixels of an active matrix substrate 1a_2 according to the present modification. In FIG. 10, components like to those according to the second embodiment are designated by reference characters like to those according to the second embodiment.

As illustrated in FIG. 10, bias wiring lines 36 according to the present embodiment are formed on the flattening films 107 above the photodiodes 12. In this example, each bias wiring line 36 may have a structure in which a first wiring line layer composed of metal film and a second wiring line layer composed of transparent conductive film such as ITO are stacked in order. The first wiring line layer that is a lower layer may have a structure in which metal films of titanium (Ti), aluminum (Al), and titanium (Ti), for example, are stacked. The bias wiring lines 36 are disposed so as to overlap the photodiodes 12 in a plan view, and accordingly, the second wiring line layer that is an upper layer is preferably a transparent conductive film.

Also, with this structure, the source wiring lines 10 and the gate wiring lines 11 are formed in the source layer as in the second embodiment described above. For this reason, the resistivity of the source wiring lines 10 and the gate wiring lines 11 can be decreased by increasing the thicknesses of the gate wiring lines 11 and the source wiring lines 10 collectively in the processes for manufacturing the active matrix substrate 1a_2.

(2) In examples described according to the above first and second embodiments, the source wiring lines 10 and the gate wiring lines 11 are formed in the source layer in which parts of the TFTs 13 (the source electrodes 13c and the drain electrodes 13d) are formed, but the layer in which the wiring lines are formed is not limited thereto. For example, the source wiring lines 10 and the gate wiring lines 11 may be formed in the same layer as the bias wiring lines 36 (see FIG. 10) according to the modification (1). In this case, contacts for connecting the source wiring lines 10 to the source electrodes 13c and contacts for connecting the gate wiring lines 11 to the gate electrodes 13a are provided.

(3) In an example described according to the above first embodiment, the divided bias wiring lines 16 are connected with the connection wiring lines 16c or the connection wiring lines 16g interposed therebetween. The connection wiring lines 16c are formed in the first cathode electrode layer, and the connection wiring lines 16g are formed in the gate layer. That is, according to the first embodiment, each bias wiring line 16 is connected by using any one of the connection wiring lines that are formed in two different layers. However, the structure of each bias wiring line 16 is not limited thereto. For example, the bias wiring lines 16 may be formed in a cathode layer, and the bias wiring lines 16 may be disposed so as not to overlap the photodiodes 12 in a plan view. In this case, connection members for connecting the bias wiring lines 16 and the photodiodes 12 are provided. The connection members may be formed by using a transparent conductive material such as ITO.

The imaging panels described above may also be described as follows.

An imaging panel with a first structure includes a substrate, and an imaging element that is formed on the substrate. The imaging element includes a gate line, a source line, a switching element that is connected to the gate line and the source line, a photoelectric conversion element that is connected to the switching element, and a bias line that is connected to the photoelectric conversion element. The gate line and the source line are formed in a layer in which a part of the switching element is formed, a layer in which a part of the photoelectric conversion element is formed, or a layer in which the bias line is formed.

With the first structure, the imaging element that is disposed on the substrate includes the gate line, the source line, the switching element, the photoelectric conversion element, and the bias line. The gate line and the source line are formed in the layer in which the part of the switching element, the part of the photoelectric conversion element, or the bias line is formed. For this reason, the gate line and the source line can be formed at the same time the part of the switching element, the part of the photoelectric conversion element, or the bias wiring line is formed in the processes for manufacturing the imaging panel. The thicknesses of the gate line and the source line can be increased collectively in the manufacturing processes, and the resistivity of the gate line and the source line can be decreased. Consequently, the manufacturing costs for decreasing the resistivity can be lower than those in the case where the wiring lines are formed in different layers, the transmission speed of signals on the wiring lines can be increased, and the reaction rate of the imaging panel can be increased.

In the first structure, the switching element may include a source electrode and a drain electrode. The gate line and the source line may be formed in a source layer in which the source electrode and the drain electrode are disposed (a second structure).

With the second structure, the gate line and the source line are manufactured at the same time the source electrode and the drain electrode of the switching element are manufactured in the processes for manufacturing the imaging panel.

In the second structure, the bias line may be disposed in the source layer. The imaging panel may further include a connection wiring line that connects the photoelectric conversion element and the bias line to each other. The connection wiring line may be formed in the layer in which the part of the photoelectric conversion element is formed (a third structure).

With the third structure, the bias line that is disposed in the source layer is connected to the photoelectric conversion element with the connection wiring line interposed therebetween. The connection wiring line is formed in the same layer as the part of the photoelectric conversion element. For this reason, the resistivity of the wiring lines can be decreased by increasing the thicknesses of the gate line, the source line, and the bias line collectively in the processes for manufacturing the imaging panel. The connection wiring line is simultaneously manufactured in a process of forming the photoelectric conversion element in the processes for manufacturing the imaging panel, and the manufacturing costs can be lower than those in the case where the connection wiring line is separately manufactured.

In the second or third structure, the photoelectric conversion element may be disposed so as to overlap the switching element in a plan view (a fourth structure).

With the fourth structure, the photoelectric conversion element overlaps the switching element in a plan view, and the area of the photoelectric conversion element can be larger than that in the case where the photoelectric conversion element does not overlap the switching element in a plan view.

In the second structure, the switching element may include a gate electrode, the source electrode, and the drain electrode. The bias line may be disposed in a gate layer in which the gate electrode is formed. The imaging panel may further include a connection wiring line that connects the photoelectric conversion element and the bias line to each other. The connection wiring line may be formed in the layer in which the part of the photoelectric conversion element is formed (a fifth structure).

With the fifth structure, the bias line that is formed in the gate layer is connected to the photoelectric conversion element with the connection wiring line interposed therebetween. The connection wiring line is formed in the same layer as the part of the photoelectric conversion element. For this reason, the bias line and the connection wiring line can be formed at the same time the switching element and the photoelectric conversion element are formed in the processes for manufacturing the imaging panel.

In the fifth structure, the photoelectric conversion element may include a cathode electrode. A part of the cathode electrode may be formed so as to be continuous with the drain electrode (sixth structure).

With the sixth structure, the cathode electrode of the photoelectric conversion element is formed so as to be continuous with the drain electrode. For this reason, the thicknesses of the gate line, the source line, and the cathode electrode can be increased collectively in the processes for manufacturing the imaging panel, and the costs for decreasing the resistivity of the gate line, the source line, and the cathode electrode are reduced.

The present disclosure contains subject matter related to that disclosed in U.S. Provisional Patent Application No. 62/946,480 filed in the U.S. Patent Office on Dec. 11, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging panel comprising:
 a substrate; and
 an imaging element that is formed on the substrate, wherein
 the imaging element includes:
  a gate line,
  a source line,
  a switching element that is connected to the gate line and the source line,
  a photoelectric conversion element that is connected to the switching element, and
  a bias line that is connected to the photoelectric conversion element, and
 the gate line and the source line are in an identical layer, the identical layer being:
  a layer in which a part of the switching element is formed,
  a layer in which a part of the photoelectric conversion element is formed, or
  a layer in which the bias line is formed.

2. The imaging panel according to claim 1, wherein
 the switching element includes a source electrode and a drain electrode, and
 the identical layer is a source layer in which the source electrode and the drain electrode are disposed.

3. The imaging panel according to claim 2, wherein the bias line is disposed in the source layer,
 wherein the imaging panel further comprises: a connection wiring line that connects the photoelectric conversion element and the bias line to each other, and
 wherein the connection wiring line is formed in the layer in which the part of the photoelectric conversion element is formed.

4. The imaging panel according to claim 2, wherein the photoelectric conversion element is disposed so as to overlap the switching element in a plan view.

5. The imaging panel according to claim 2, wherein the switching element includes a gate electrode, the source electrode, and the drain electrode,
 wherein the bias line is disposed in a gate layer in which the gate electrode is formed,
 wherein the imaging panel further comprises: a connection wiring line that connects the photoelectric conversion element and the bias line to each other, and
 wherein the connection wiring line is formed in the layer in which the part of the photoelectric conversion element is formed.

6. The imaging panel according to claim 5, wherein the photoelectric conversion element includes a cathode electrode, and
 wherein a part of the cathode electrode is formed so as to be continuous with the drain electrode.

* * * * *